United States Patent [19]
Takahashi

[11] Patent Number: 6,088,292
[45] Date of Patent: Jul. 11, 2000

[54] SEMICONDUCTOR MEMORY DEVICE HAVING A PLURALITY OF BANKS ACTIVATED BY A COMMON TIMING CONTROL CIRCUIT

[75] Inventor: Hiroki Takahashi, Tokyo, Japan

[73] Assignee: NEC Corporation, Tokyo, Japan

[21] Appl. No.: 09/199,052

[22] Filed: Nov. 24, 1998

[30] Foreign Application Priority Data

Nov. 28, 1997 [JP] Japan ................................. 9-328827

[51] Int. Cl.[7] ............................................. G11C 8/18
[52] U.S. Cl. ............... 365/233; 365/230.03; 365/230.08; 365/203; 365/190; 365/196; 365/189.08
[58] Field of Search ......................... 365/230.08, 230.03, 365/233, 203, 196, 189.08, 190

[56] References Cited

U.S. PATENT DOCUMENTS

| 5,036,493 | 7/1991 | Nielsen ................................ 365/230.03 |
| 5,495,454 | 2/1996 | Fukuzo ................................ 365/230.08 |
| 5,559,752 | 9/1996 | Stephens, Jr. et al. ................. 365/233 |
| 5,774,409 | 6/1998 | Yamazaki et al. ................. 365/230.03 |

FOREIGN PATENT DOCUMENTS

| 6-275071 | 9/1994 | Japan ............................ G11C 11/406 |
| 11-203867 | 7/1999 | Japan ............................ G11C 11/407 |
| 11-242885 | 9/1999 | Japan ............................ G11C 11/406 |
| 2 316 208 | 2/1998 | United Kingdom ............. G11C 7/00 |
| WO 98/25345 | 6/1998 | WIPO ............................... H03K 5/00 |

*Primary Examiner*—Andrew Q. Tran
*Attorney, Agent, or Firm*—Young & Thompson

[57] ABSTRACT

A semiconductor memory includes a plurality of banks, a timing control circuits, and latch circuits. The timing control circuit is arranged commonly to the plurality of banks and outputs a signal for activating each bank and a signal for precharging each bank in a predetermined order at predetermined timings. Each latch circuit is arranged for each bank and latches the state of a signal output from the timing control circuit.

7 Claims, 18 Drawing Sheets

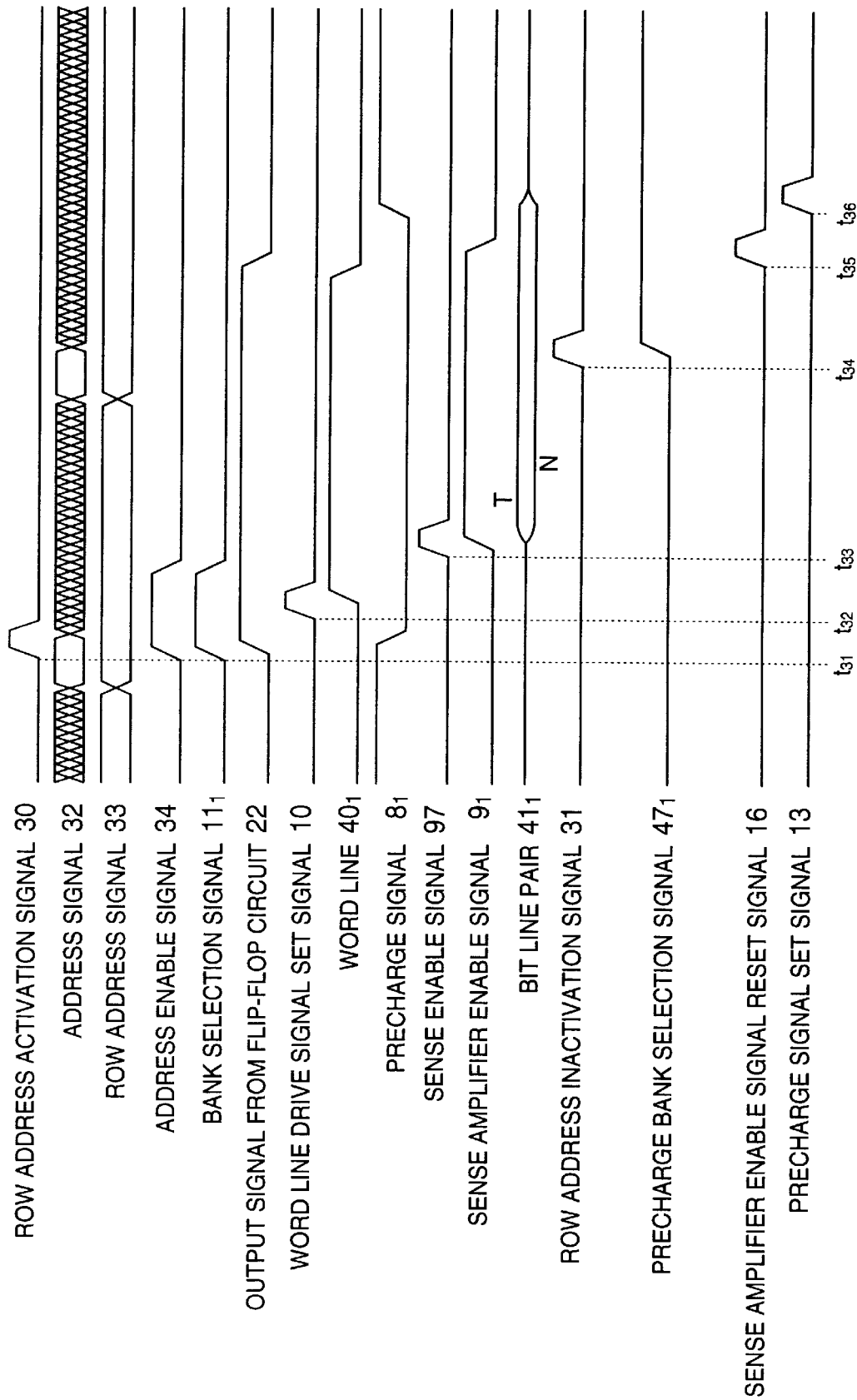

SEMICONDUCTOR MEMORY DEVICE HAVING A PLURALITY OF BANKS ACTIVATED BY A COMMON TIMING CONTROL CIRCUIT

BACKGROUND OF THE INVENTION

1. Field of the Invention

The present invention relates to a semiconductor memory device and, more particularly, to a semiconductor memory device whose memory area is constituted by a plurality of banks.

2. Description of the Prior Art

Generally, in a conventional semiconductor memory device such as a DRAM, memory cells are formed at the intersections of a plurality of bit line pairs and a plurality of word lines. Memory information of a target memory cell can be read out by selecting a word line by a row address and a bit line pair by a column address.

In a conventional semiconductor memory device such as a DRAM, the memory area is divided into a plurality of blocks due to an increase in memory capacity and limitations on the length of the bit line pair.

To read out memory information stored in the memory cell of the semiconductor memory device constituted by a plurality of blocks, a row address is first designated, and then a column address and block address are designated. After the addresses are designated, various operations such as a data write and read are performed upon reception of external commands.

FIG. 1 is a block diagram showing a semiconductor memory device constituted by a plurality of blocks as the first prior art.

In this conventional semiconductor memory device, the memory area is made up of two blocks 121 and 122.

The semiconductor memory device comprises the blocks 121 and 122, an address buffer 91, and a timing control circuit 93.

When a row address activation signal 30 becomes active, the timing control circuit 93 activates an address enable signal 100 and changes a word line drive signal 97, a precharge signal 98, and a sense amplifier enable signal 99 from high level (to be referred to as H hereinafter) to low level (to be referred to as L hereinafter) or from L to H at predetermined timings in a predetermined order.

The row address activation signal 30 is activated by an external command.

When the address enable signal 100 becomes active, the address buffer 91 latches and outputs a row address included in an address signal 32 as a row address signal 33, and changes a block selection signal $90_1$ or $90_2$ to H in order to activate a block designated by the block address of the address signal 32.

The block 121 is constituted by bit line pairs $41_1$ to $41_n$, word lines $40_1$ to $40_m$, an SAP, an SAN, a plurality of memory cells 17 respectively arranged at the intersections of the bit line pairs $41_1$ to $41_n$ and word lines $40_1$ to $40_m$, precharge circuits $18_1$ to $18_n$ respectively arranged on the bit line pairs $41_1$ to $41_n$, a precharge circuit 19 arranged between the SAP and SAN, sense amplifiers $29_1$ to $29_n$ respectively arranged on the bit line pairs $41_1$ to $41_n$, a row decoder $115_1$, an AND circuit 101, an OR circuit 102, an inverter 103, an AND circuit 104, an inverter 42, a p-channel MOS transistor 38, and an n-channel MOS transistor 39.

The AND circuit 101 ANDs the word line drive signal 97 and a block selection signal $90_1$ and outputs the AND as a word line drive signal $7_1$.

When the word line drive signal $7_1$ changes to H, the row decoder $115_1$ activates a word line designated by the row address signal 33 from the word lines $40_1$ to $40_m$.

As shown in FIG. 2, the row decoder $115_1$ is made up of address decoders $140_1$ to $140_m$.

The address decoders $140_1$ to $140_m$ are respectively arranged for the word lines $40_1$ to $40_m$. In the address decoders $140_1$ to $140_m$, the addresses of corresponding word lines are set. When the word line drive signal $7_1$ changes to H, the address decoders $140_1$ to $140_m$ operate. If an address indicated by the row address signal 33 is a set address, each address decoder activates a corresponding word line.

The inverter 103 inverts the logic of the block selection signal $90_1$ and outputs the inverted signal.

The OR circuit 102 ORs the output signal from the inverter 103 and the precharge signal 98 and outputs the OR.

When the output signal from the OR circuit 102 changes to H, the precharge circuits $18_1$ to $18_n$ precharge the bit line pairs $41_1$ to $41_n$, fix them to a constant potential level, and keep them at the same level.

Similarly, when the output signal from the OR circuit 102 changes to H, the precharge circuit 19 precharges the SAP and SAN, fixes them at a constant potential level, and keeps them at the same level.

The AND circuit 104 ANDs the sense amplifier enable signal 99 and the block selection signal $90_1$ and outputs the AND as a sense amplifier enable signal $9_1$.

The inverter 42 inverts the logic of the sense amplifier enable signal $9_1$.

The output signal from the inverter 42 is input to the gate of the p-channel MOS transistor 38. When the output signal from the inverter 42 changes to L, the p-channel MOS transistor 38 is turned on to apply a voltage VDD to the SAP.

The sense amplifier enable signal $9_1$ is input to the gate of the n-channel MOS transistor 39. When the sense amplifier enable signal $9_1$ changes to H, the n-channel MOS transistor 39 is turned on to apply a ground voltage to the SAN.

When both the p-channel MOS transistor 38 and n-channel MOS transistor 39 are turned on, the sense amplifiers $29_1$ to $29_n$ operate to amplify the voltage output to the bit line pairs $41_1$ to $41_n$ and externally output the amplified voltage via a column selection circuit and input/output circuit (neither is shown).

The block 122 has the same arrangement as that of the block 121 except that a block selection signal $90_2$ is input instead of the block selection signal $90_1$, and a description thereof will be omitted.

Operation of the conventional semiconductor memory device will be explained with reference to FIGS. 1 and 2 and a timing chart of FIG. 3.

The following description concerns a read, and a write is similarly performed.

Operation for reading out data of the memory cell 17 formed at the intersection of the bit line pair $41_1$ and word line $40_1$ in the block 121 will be explained.

When an external command and the address signal 32 are input at $t_{41}$, the external command activates the row address activation signal 30, and the timing control circuit 93 activates the address enable signal 100. The address buffer 91 latches and outputs the row address of the address signal 32 as the row address signal 33. A blank portion of the address signal 32 in FIG. 3 represents the location of the row address read as the row address signal 33. Since the block address indicates the block 121, the address buffer 91 changes the block selection signal $90_1$ to H.

At $t_{42}$, the timing control circuit 93 changes the precharge signal 98 to L to change the precharge signal $8_1$ to L, thereby inactivating the precharge circuits $18_1$ to $18_n$ and the precharge circuit 19. The timing control circuit 93 changes the word line drive signal 97 to H to change the word line drive signal $7_1$ to H, thereby activating the word line $40_1$. At $t_{43}$, the timing control circuit 93 changes the sense amplifier enable signal 99 to H to change the sense amplifier enable signal $9_1$ to H. thereby turning on the p-channel MOS transistor 38 and the n-channel MOS transistor 39 and activating the sense amplifiers $29_1$ to $29_n$.

As a result, data stored in the memory cell 17 formed at the intersection of the bit line pair $41_1$ and word line $40_1$ is output to the sense amplifier $29_1$ via the bit line pair $41_1$ and amplified, and the amplified data is output.

After the data is read out, the block 121 is inactivated. More specifically, at $t_{44}$, the timing control circuit 93 changes the word line drive signal 97 to L to change the word line drive signal $7_1$ to L, thereby inactivating the word line $40_1$. At $t_{45}$, the timing control circuit 93 changes the sense amplifier enable signal 99 to L to change the sense amplifier enable signal $9_1$ to L, thereby inactivating the sense amplifiers $29_1$ to $29_n$. At $t_{46}$, the timing control circuit 93 changes the precharge signal 98 to H to change the precharge signal $8_1$ to H, thereby activating the precharge circuits $18_1$ to $18_n$ and 19. That is, the bit line pair $41_1$, SAP, and SAN are charged to a given voltage, and voltages across lines are set to the same level.

However, if the semiconductor memory device is constituted by a plurality of blocks, and signals are controlled by one timing control circuit 93, while a certain block is processed, another block cannot be processed. As the memory capacity and the number of blocks increase, a longer time is undesirably spent to read out memory contents.

To solve this problem, a semiconductor memory device is constituted by not a plurality of blocks but banks capable of operating independently of each other.

A semiconductor memory device constituted by a plurality of banks according to the second prior art will be described with reference to FIG. 4. The same reference numerals as in FIG. 1 denote the same parts.

In this semiconductor memory device, the memory area is made up of four divided banks 171 to 174.

The conventional semiconductor memory device is constituted by the banks 171 to 174, timing control circuits $110_1$ to $110_4$ respectively arranged for the banks 171 to 174, latch circuits $111_1$ to $111_4$ respectively arranged for the timing control circuits $110_1$ to $110_4$, a row address buffer 45, and a bank decoder 143.

The row address buffer 45 outputs the row address of an address signal 32 as a row address signal 33.

The bank decoder 143 activates for a predetermined time bank selection signals $11_1$ to $11_4$ for activating a bank indicated by the bank address of the address signal 32.

The latch circuits $111_1$ to $111_4$ read a row address activation signal 30 and a row address inactivation signal 31 only when the corresponding bank selection signals $11_1$ and $11_4$ are active. If the row address activation signal 30 becomes active, the latch circuits $111_1$ to $111_4$ activate a row address activation signal $112_1$. If the row address inactivation signal 31 becomes active, the latch circuits $111_1$ to $111_4$ inactivate the row address activation signal $112_1$.

The timing control circuits $110_1$ to $110_4$ perform the same operation as that of the timing control circuit 93 in FIG. 1 except that they do not output the address enable signal 100. The timing control circuits $110_1$ to $110_4$ output word line drive signals $7_1$ to $7_4$ instead of the word line drive signal 97, output precharge signals $8_1$ to $8_4$ instead of the precharge signal 98, output sense amplifier enable signals $9_1$ to $9_4$ instead of the sense amplifier enable signal 99, and receive the row address activation signal $112_1$ instead of the row address activation signal 30.

The bank 171 is constituted by bit line pairs $41_1$ to $41_n$, word lines $40_1$ to $40_m$, an SAP, an SAN, a plurality of memory cells 17 respectively formed at the intersections of the bit line pairs $41_1$ to $41_n$ and word lines $40_1$ to $40_m$, precharge circuits $18_1$ to $18_n$ respectively arranged on the bit line pairs $41_1$ to $41_1$, a precharge circuit 19 arranged between the SAP and SAN, sense amplifiers $29_1$ to $29_n$ respectively arranged on the bit line pairs $41_1$ to $41_n$, a row decoder $135_1$, an inverter 42, a p-channel MOS transistor 38, and an n-channel MOS transistor 39.

When the word line drive signal $7_1$ changes to H, the row decoder $135_1$ latches the row address signal 33 in accordance with the bank selection signal $11_1$, and activates a word line designated by the row address signal 33 from the word lines $40_1$ to $40_m$.

As shown in FIG. 5, the row decoder $135_1$ is made up of address decoders $140_1$ to $140_m$ and a latch circuit $141_1$.

The latch circuit $141_1$ latches and outputs the row address signal 33 in accordance with the bank selection signal $11_1$. The address decoders $140_1$ to $140_m$ receive the row address signal 33 latched and output by the latch circuit $141_1$.

Operation of the semiconductor memory device according to the second prior art will be described.

Operation for reading out data of the memory cell 17 formed at the intersection of the bit line pair $41_1$ and word line $40_1$ in the bank 171 will be explained.

The row address activation signal 30 becomes active, and the address signal 32 including a row address indicating the address of the word line $40_1$ and a bank address indicating the bank 171 is externally input. Then, the row address buffer 45 outputs the row address of the address signal 32 as the address signal 33, and the bank decoder 143 activates the bank selection signal $11_1$.

Since the bank selection signal $11_1$ and row address activation signal 30 become active, the latch circuit $111_1$ activates the row address activation signal $112_1$.

Since the row address activation signal $112_1$ becomes active, the timing control circuit $110_1$ controls the word line drive signal $7_1$, precharge signal $8_1$, and sense amplifier enable signal $9_1$ to perform a read from the memory cell 17 and inactivation after the read.

At this time, since the bank selection signal $11_1$ is active, the row decoder $135_1$ latches the row address signal 33 and activates the word line $40_1$ indicated by the latched row address signal 33.

Operation for designating inactivation of the bank 172 while reading out data stored in the memory cell 17 in the bank 171 will be explained.

The bank address included in the address signal 32 input externally is switched to designate the bank 172. The bank decoder 143 inactivates the bank selection signal $11_1$ and activates the bank selection signal $11_2$. The latch circuit $111_1$ keeps the row address activation signal $112_1$ active regardless of changes in row address activation signal 30 and row address inactivation signal 31 by the inactive bank selection signal $11_1$. The row decoder $135_1$ also keeps the word line $40_1$ active regardless of changes in row address signal 33 by the inactive bank selection signal $11_1$. In this manner, in the bank 171, data can be read out regardless of changes in row address signal.

Since the bank selection signal $11_2$ and row address inactivation signal 31 become active, the bank 172 is inactivated.

Operation for simultaneously performing a data read of the bank 171 and inactivation of the bank 172 has been described above. Similarly, in the conventional semiconductor memory device, a data read or inactivation of a given bank and a data read or inactivation of another bank can be simultaneously performed.

However, the semiconductor memory device according to the second prior art requires timing control circuits equal in number to the banks. As the number of banks increases, the number of timing control circuits also increases accordingly.

FIG. 6 shows an example of a general timing control circuit.

A timing control circuit 192 shown in FIG. 6 is constituted by delay circuits $191_1$ to $191_3$ and drivers $190_1$ to $190_3$. The timing control circuit 192 receives an input signal 194 and outputs control signals $193_1$ to $193_3$ at different timings.

Each of the delay circuits $191_1$ to $191_3$ is made up of a plurality of series-connected inverters. The delay circuits $191_1$ to $191_3$ are also series-connected to each other. An output from the delay circuit $191_1$ is output as the control signal $193_1$ via the driver $190_1$. An output from the delay circuit $191_2$ is output as the control signal $193_2$ via the driver $190_2$. An output from the delay circuit $191_3$ is output as the control signal $193_3$ via the driver $190_3$.

The control signals $193_1$ to $193_3$ correspond to the word line drive signal $7_1$, precharge signal $8_1$, and sense amplifier enable signal $9_1$.

Since the drivers $190_1$ to $190_3$ supply signals delayed by the delay circuits $191_1$ to $191_3$ as the control signals $193_1$ to $193_3$ to respective circuits, the timing control circuit 192 must use large inverters. Consequently, the occupied area of the timing control circuit is generally larger than the occupied area of another circuit. As the number of banks increases to 4, 8, 16, ... along with an increase in memory capacity of recent semiconductor memory devices, the circuit area of the timing control circuit greatly increases.

The semiconductor memory device according to the second prior art requires the timing control circuits equal in number to the banks. For this reason, as the number of banks increases, the circuit area of the timing control circuits greatly increases.

SUMMARY OF THE INVENTION

The present invention has been made in consideration of the above situation in the prior art, and has as its object to provide a semiconductor memory device in which the circuit area of a timing control circuit can be prevented from increasing considerably even if the number of banks increases.

To achieve the above object, according to the first aspect of the present invention, there is provided a semiconductor memory device comprising a plurality of banks, a timing control circuit which is arranged common to the plurality of banks and outputs a signal for activating each bank and a signal for precharging each bank in a predetermined order at predetermined timings, and latch circuits each of which is arranged for each bank and latches a state of a signal output from the timing control circuit.

According to the first aspect, the latch circuit for latching the state of a signal output from the timing control circuit is arranged for each bank, and one timing control circuit is shared by a plurality of banks.

Even if the number of banks increases, the circuit area of the timing control circuit can be prevented from increasing greatly.

According to the second aspect of the present invention, there is provided a semiconductor memory device wherein signals output from each latch circuit are a word line drive signal for controlling activation of a word line, a precharge signal for controlling precharging, and a sense amplifier enable signal for controlling a sense amplifier operation, the signal for activating each bank includes a word line drive signal set signal for setting the word line drive signal to be active, a precharge signal reset signal for inactivating the precharge signal, and a sense amplifier enable signal set signal for setting the sense amplifier enable signal to be active, and the signal for precharging each bank includes a word line drive signal reset signal for setting the word line drive signal to be inactive, a precharge signal set signal for setting the precharge signal to be active, and a sense amplifier enable signal reset signal for setting the sense amplifier enable signal to be inactive.

According to the third aspect of the present invention, there is provided a semiconductor memory device comprising a plurality of banks each having a plurality of memory cells respectively formed at intersections of a plurality of bit line pairs and a plurality of word lines, a plurality of precharge circuits each of which is arranged for each bit line pair and precharges the bit line pair when a precharge signal becomes active, a plurality of sense amplifiers each of which is arranged for each bit line pair and amplifies a voltage output to the bit line pair when a sense amplifier enable signal becomes active, and a row decoder which incorporates a row latch circuit for latching a selected/unselected state of a word line indicated by a row address when each bank is activated, and activates the word line indicated by the row latch circuit when a word line drive signal becomes active, a timing control circuit having an active timing chain for controlling a word line drive signal set signal, a precharge signal reset signal, and a sense amplifier enable signal set signal in a predetermined order at predetermined timings when a row address activation signal becomes active, and a precharge timing chain for controlling a word line drive signal reset signal, a precharge signal set signal, and a sense amplifier enable signal reset signal in a predetermined order at predetermined timings when a row address inactivation signal becomes active, a bank decoder for activating a bank selection signal for selecting a bank indicated by a bank address included in an address signal, a row address buffer for outputting as a row address signal a row address included in the address signal, and a plurality of latch circuits each of which is arranged for each bank, receives the bank selection signal, activates the word line drive signal when a corresponding bank selection signal is active and the word line drive signal set signal becomes active, inactivates the word line drive signal when the word line drive signal reset signal becomes active, activates the precharge signal when the precharge signal set signal becomes active, inactivates the precharge signal when the precharge signal reset signal becomes active, activates the sense amplifier enable signal when the sense amplifier enable signal set signal becomes active, and inactivates the sense amplifier enable signal when the sense amplifier enable signal reset signal becomes active.

According to the third aspect, the latch circuit for latching the state of a signal output from the timing control circuit in accordance with the bank selection signal is arranged for each bank, and one timing control circuit is shared by a plurality o banks.

Even if the number of banks increases, the circuit area of the timing control circuit can be prevented from increasing greatly.

According to the fourth aspect of the present invention, there is provided a semiconductor memory device, wherein each latch circuit comprises a first logic circuit for activating an output signal when both the word line drive signal set signal and the bank selection signal are active, a second logic circuit for activating an output signal when both the word line drive signal reset signal and the bank selection signal are active, a third logic circuit for activating an output signal when both the precharge signal set signal and the bank selection signal are active, a fourth logic circuit for activating an output signal when both the precharge signal reset signal and the bank selection signal are active, a fifth logic circuit for activating an output signal when both the sense amplifier enable signal set signal and the bank selection signal are active, a sixth logic circuit for activating an output signal when both the sense amplifier enable signal reset signal and the bank selection signal are active, a first flip-flop circuit which is set by the output signal from the first logic circuit, reset by the output signal from the second logic circuit, and outputs an output signal as the word line drive signal, a second flip-flop circuit which is set by the output signal from the third logic circuit, reset by the output signal from the fourth logic circuit, and outputs an output signal as the precharge signal, and a third flip-flop circuit which is set by the output signal from the fifth logic circuit, reset by the output signal from the sixth logic circuit, and outputs an output signal as the sense amplifier enable signal.

According to the fifth aspect of the present invention, there is provided a semiconductor memory device, wherein the device further comprises a precharge bank decoder for activating a precharge bank selection signal for selecting a bank indicated by a precharge bank address included in the address signal, and the latch circuit activates the word line drive signal reset signal, the precharge signal set signal, and the sense amplifier enable signal reset signal as signals for performing precharging only when the precharge bank selection signal is active.

According to the fifth aspect, the precharge bank decoder is further arranged to allow to designate a bank to be precharged by a precharge bank address other than a bank address.

During a set sequence for a given bank, a reset sequence for another bank can be performed.

According to the sixth aspect of the present invention, there is provided a semiconductor memory device, wherein each latch circuit comprises a first logic circuit for activating an output signal when both the word line drive signal set signal and the bank selection signal are active, a second logic circuit for activating an output signal when both the word line drive signal reset signal and the precharge bank selection signal are active, a third logic circuit for activating an output signal when both the precharge signal set signal and the precharge bank selection signal are active, a fourth logic circuit for activating an output signal when both the precharge signal reset signal and the bank selection signal are active, a fifth logic circuit for activating an output signal when both the sense amplifier enable signal set signal and the bank selection signal are active, a sixth logic circuit for activating an output signal when both the sense amplifier enable signal reset signal and the precharge bank selection signal are active, a first flip-flop circuit which is set by the output signal from the first logic circuit, reset by the output signal from the second logic circuit, and outputs an output signal as the word line drive signal, a second flip-flop circuit which is set by the output signal from the third logic circuit, reset by the output signal from the fourth logic circuit, and outputs an output signal as the precharge signal, and a third flip-flop circuit which is set by the output signal from the fifth logic circuit, reset by the output signal from the sixth logic circuit, and outputs an output signal as the sense amplifier enable signal.

According to the seventh aspect of the present invention, there is provided a semiconductor memory device comprising a plurality of banks each having a plurality of memory cells respectively formed at intersections of a plurality of bit line pairs and a plurality of word lines, a plurality of precharge circuits each of which is arranged for each bit line pair and precharges the bit line pair when a precharge signal becomes active, a plurality of sense amplifiers each of which is arranged for each bit line pair and amplifies a voltage output to the bit line pair when a sense amplifier enable signal becomes active, and a row decoder which operates when a word line drive signal becomes active, and latches a row address signal to activate a word line indicated by the row address signal only when a bank selection signal is active, a timing control circuit having an active timing chain for, when a row address activation signal becomes active, controlling in a predetermined order at a predetermined timing a sense enable signal serving as a signal for controlling timings at which the word line drive signal set signal and the sense amplifier enable signal are activated, and a precharge timing chain for controlling a precharge signal set signal and a sense amplifier enable signal reset signal in a predetermined order at predetermined timings when a row address inactivation signal becomes active, a bank decoder for activating a bank selection signal for selecting a bank indicated by a bank address included in an address signal, a precharge bank decoder for activating a precharge bank selection signal for selecting a bank indicated by a precharge bank address included in the address signal, a row address buffer for outputting as the row address signal a row address included in the address signal, and a plurality of latch circuits each of which is arranged for each bank, receives the bank selection signal, activates the word line drive signal when a corresponding bank selection signal and the word line drive signal set signal become active, inactivates the word line drive signal when the precharge bank selection signal becomes active, activates the precharge signal when the precharge bank selection signal and the precharge signal set signal become active, inactivates the precharge signal when the bank selection signal becomes active, activates the sense amplifier enable signal when the bank selection signal and the sense enable signal become active, and inactivates the sense amplifier enable signal when the precharge bank selection signal and the sense amplifier enable signal reset signal become active.

According to the seventh aspect, the precharge bank selection signal is used as a signal for resetting the word line drive signal. The bank selection signal is used as a signal for resetting the precharge signal and a signal for setting the sense amplifier enable signal. The timing at which the sense amplifier enable signal is activated is controlled by the sense enable signal.

The number of signals output from the timing control circuit to each latch circuit decreases, the number of interconnections between the timing control circuit and the latch circuit decreases, and thus the circuit area of the timing control circuit reduces.

According to the eighth aspect of the present invention, there is provided a semiconductor memory device, wherein each latch circuit comprises a first logic circuit for activating an output signal when both the word line drive signal set signal and the bank selection signal are active, a second logic circuit for activating an output signal when both the precharge signal set signal and the bank selection signal are active, a third logic circuit for activating an output signal when both the sense amplifier enable signal reset signal and the bank selection signal are active, a first flip-flop circuit which is set by the output signal from the first logic circuit, reset by the precharge bank selection signal, and outputs an output signal as the word line drive signal, a second flip-flop circuit which is set by the output signal from the second logic circuit, reset by the bank selection signal, and outputs an output signal as the precharge signal, a third flip-flop circuit which is set by the bank selection signal and reset by the output signal from the third logic circuit, and a circuit for latching an output signal from the third flip-flop circuit and outputting the output signal as the sense amplifier enable signal when the sense enable signal becomes active.

As is apparent from the above aspects, the present invention has the following effects.

(1) Since a plurality of banks share one timing control circuit, the circuit area of the timing control circuit can be prevented from increasing greatly even if he number of banks increases.

(2) Since a plurality of banks share one timing control circuit, the timings of set and reset sequences or respective banks can be synchronized.

(3) When the timing is slightly adjusted for each bank, it can be adjusted with a relatively definite value from the reference timing by adding a small delay element to the output of the latch circuit.

(4) By preparing set and reset timing chains in the timing control circuit, activation and precharging can be simultaneously performed for different banks, resulting in high chip performance.

The above and many other objects, features and advantages of the present invention will become manifest to those skilled in the art upon making reference to the following detailed description and accompanying drawings in which preferred embodiments incorporating the principles of the present invention are shown by way of illustrative examples.

BRIEF DESCRIPTION OF THE DRAWINGS

FIG. 19 is a timing chart for explaining operation of the semiconductor memory device shown in FIG. 17.

DETAILED DESCRIPTION OF PREFERRED EMBODIMENTS

Several preferred embodiments of the present invention will be described in detail below with reference to the accompanying drawings.

Figure 7:
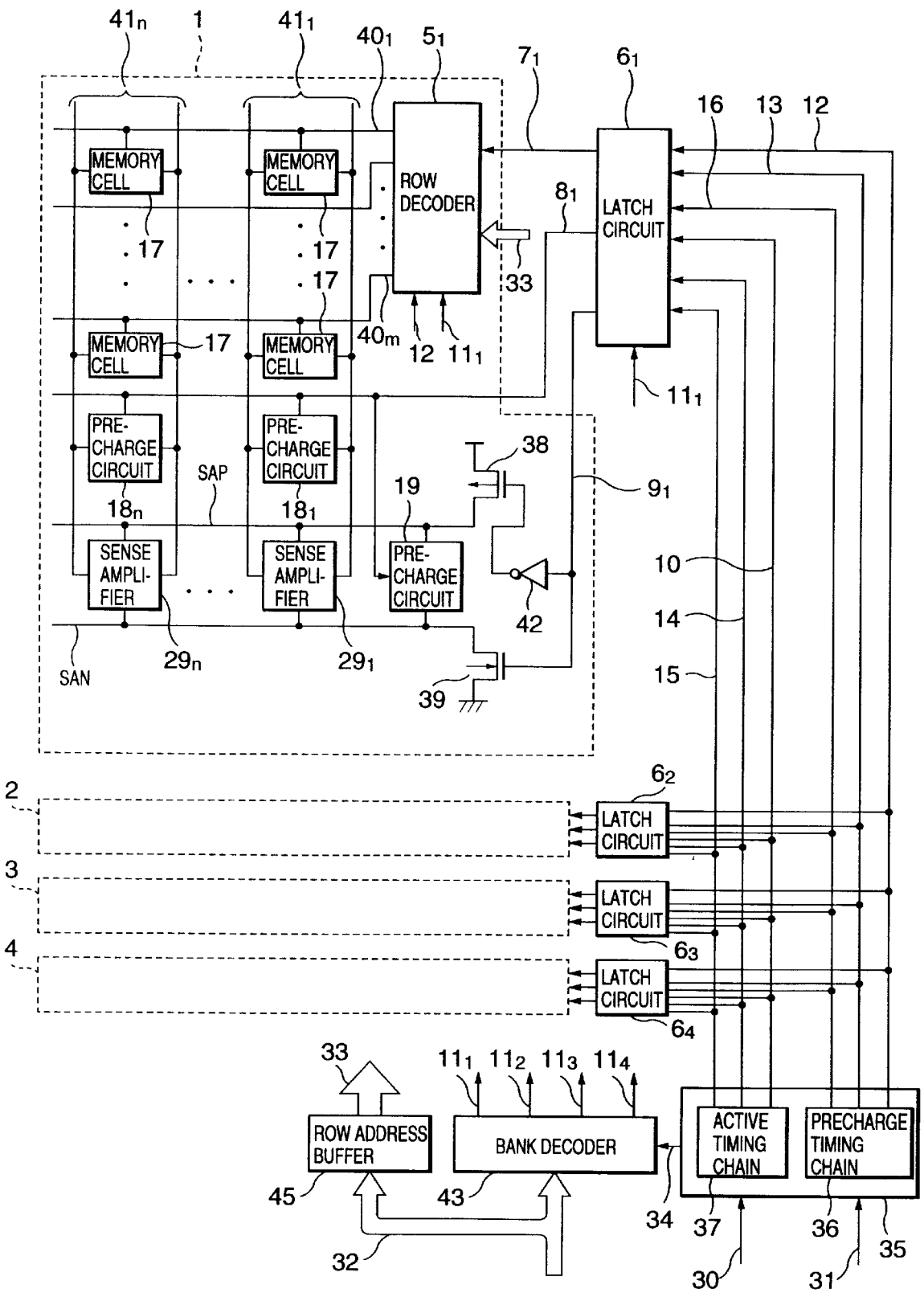
FIG. 7 is a block diagram schematically showing the arrangement of a semiconductor memory device according to the first embodiment of the present invention.

FIG. 7 is a block diagram showing the arrangement of a semiconductor memory device according to the first embodiment of the present invention. The same reference numerals as in FIG. 4 denote the same parts.

The semiconductor memory device of the first embodiment is constituted by banks 1 to 4, latch circuits $6_1$ to $6_4$ respectively arranged for the banks 1 to 4, a row address buffer 45, a bank decoder 43, and a timing control circuit 35.

The timing control circuit 35 is made up of an active timing chain 37 and a precharge timing chain 36.

When a row address activation signal 30 becomes active, the active timing chain 37 controls a word line drive signal set signal 10, a precharge signal reset signal 14, and a sense amplifier enable signal set signal 15 in a predetermined order at predetermined timings.

When a row address inactivation signal 31 becomes active, the precharge timing chain 36 controls a word line drive signal reset signal 12, a precharge signal set signal 13, and a sense amplifier enable signal reset signal 16 in a predetermined order at predetermined timings.

When either the row address activation signal 30 or row address inactivation signal 31 becomes active, the timing control circuit 35 activates an address enable signal 34.

When the address enable signal 34 is active, the bank decoder 43 operates to activate any one of bank selection signals 112 to 114 so as to activate a bank indicated by the bank address included in an address signal 32.

The latch circuits $6_1$ to $6_4$ respectively receive the bank selection signals $11_1$ to $11_4$. When the corresponding bank selection signals $11_1$ to $11_4$ are active, the latch circuits $6_1$ to $6_4$ change a word line drive signal $7_1$ to H for an H word line drive signal set signal 10, change the word line drive signal $7_1$ to L for an H word line drive signal reset signal 12, change a precharge signal $8_1$ to L for an H precharge signal reset signal 14, change the precharge signal $8_1$ to H for an H precharge signal set signal 13, change a sense amplifier enable signal $9_1$ to H for an H sense amplifier enable signal set signal 15, and change the sense amplifier enable signal $9_1$ to L for an H sense amplifier enable signal reset signal 16.

Figure 8:
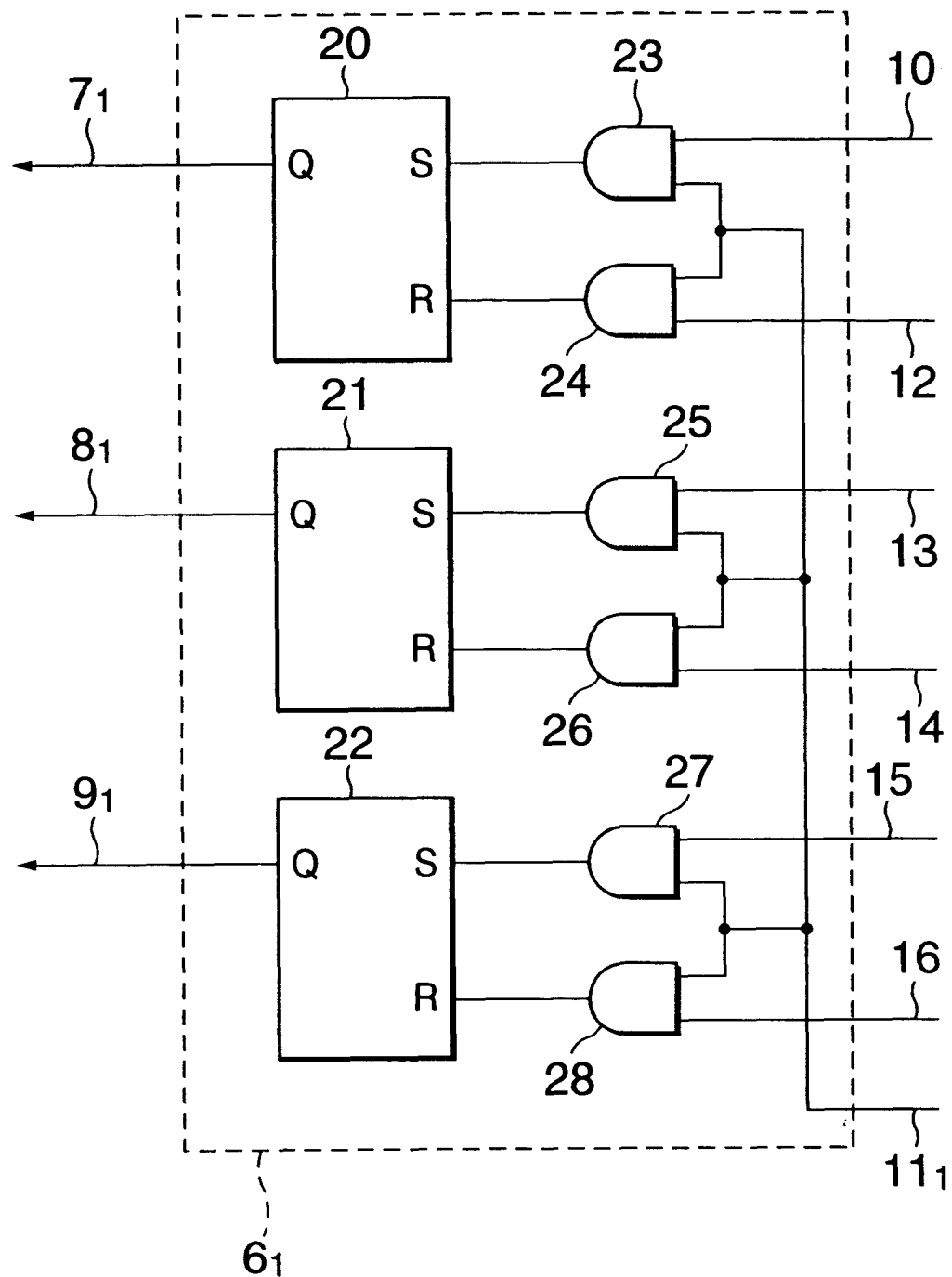
FIG. 8 is a circuit diagram schematically showing the arrangement of a latch circuit $6_1$ in FIG. 7.

As shown in FIG. 8, the latch circuit 6 is made up of flip-flop circuits 20 to 22 and AND circuits 23 to 28.

The AND circuit 23 ANDs the word line drive signal set signal 10 and the bank selection signal $11_1$ and outputs the AND.

The AND circuit 24 ANDs the word line drive signal reset signal 12 and the bank selection signal $11_1$ and outputs the AND.

The AND circuit 25 ANDs the precharge signal set signal 13 and the bank selection signal $11_1$ and outputs the AND.

The AND circuit 26 ANDs the precharge signal reset signal 14 and the bank selection signal $11_1$ and outputs the AND.

The AND circuit 27 ANDs the sense amplifier enable signal set signal 15 and the bank selection signal $11_1$ and outputs the AND.

The AND circuit 28 ANDs the sense amplifier enable signal reset signal 16 and the bank selection signal $11_1$ and outputs the AND.

The flip-flop circuit 20 is set by an output signal from the AND circuit 23, reset by an output signal from the AND circuit 24, and outputs an output signal as the word line drive signal $7_1$.

The flip-flop circuit 21 is set by an output signal from the AND circuit 25, reset by an output signal from the AND circuit 26, and outputs an output signal as the precharge signal $8_1$.

The flip-flop circuit 22 is set by an output signal from the AND circuit 27, reset by an output signal from the AND circuit 28, and outputs an output signal as the sense amplifier enable signal $9_1$.

The flip-flop circuits 20 to 22 are constituted with such logic as to be set and reset when an input signal changes from L to H.

The latch circuits $6_2$ to $6_4$ have the same arrangement as that of the latch circuit $6_1$. They respectively receive the bank selection signals $11_2$ to $11_4$ (none of them are shown) instead of the bank selection signal $11_1$, respectively output word line drive signals $7_2$ to $7_4$ instead of the word line drive signal $7_1$, respectively output precharge signals $8_2$ to $8_4$ instead of the precharge signal $8_1$, and respectively output sense amplifier enable signals $9_2$ to $9_4$ instead of the sense amplifier enable signal $9_1$.

Figure 1:
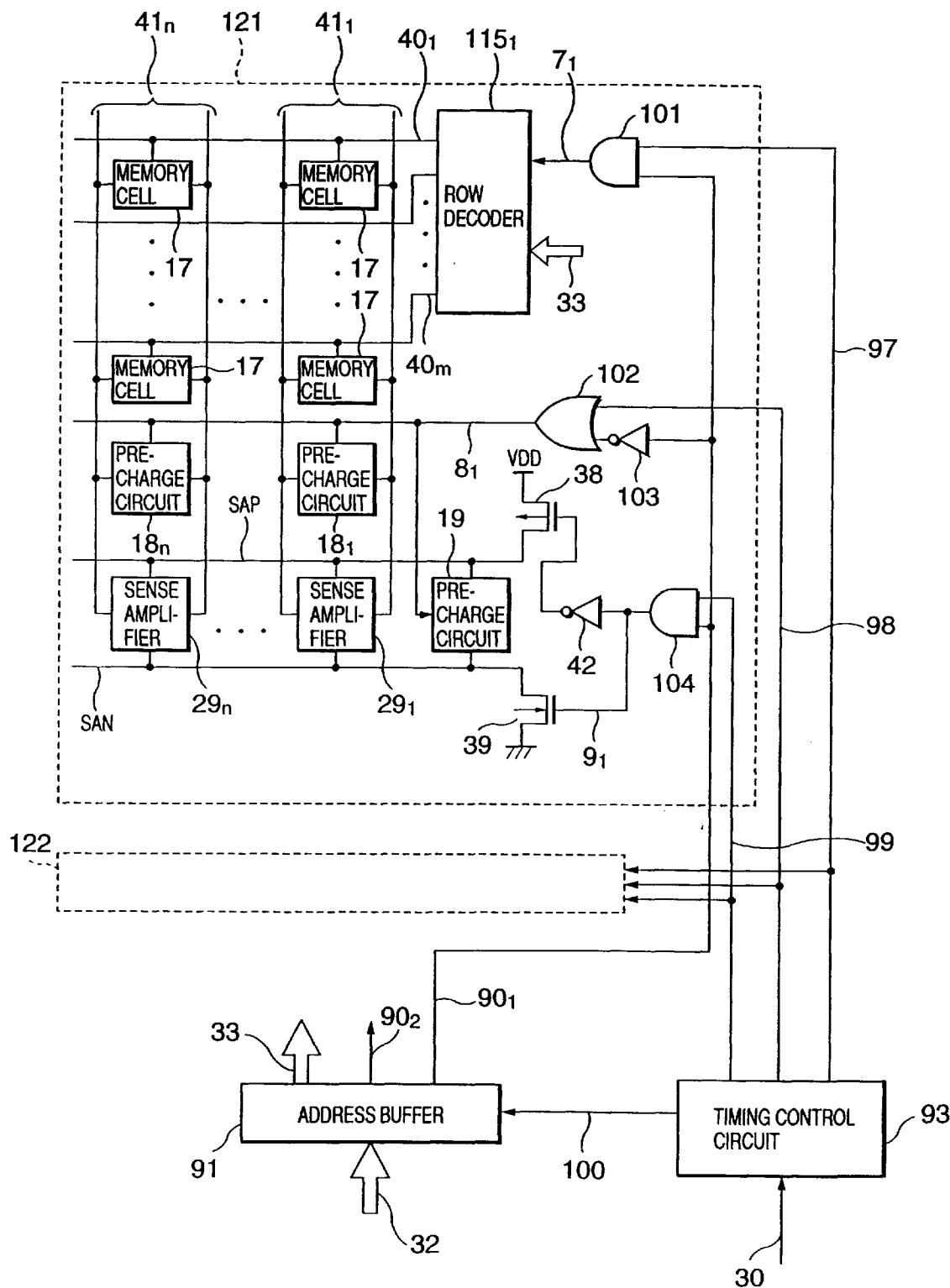
FIG. 1 is a block diagram schematically showing the arrangement of a semiconductor memory device according to the first prior art.
Figure 2:
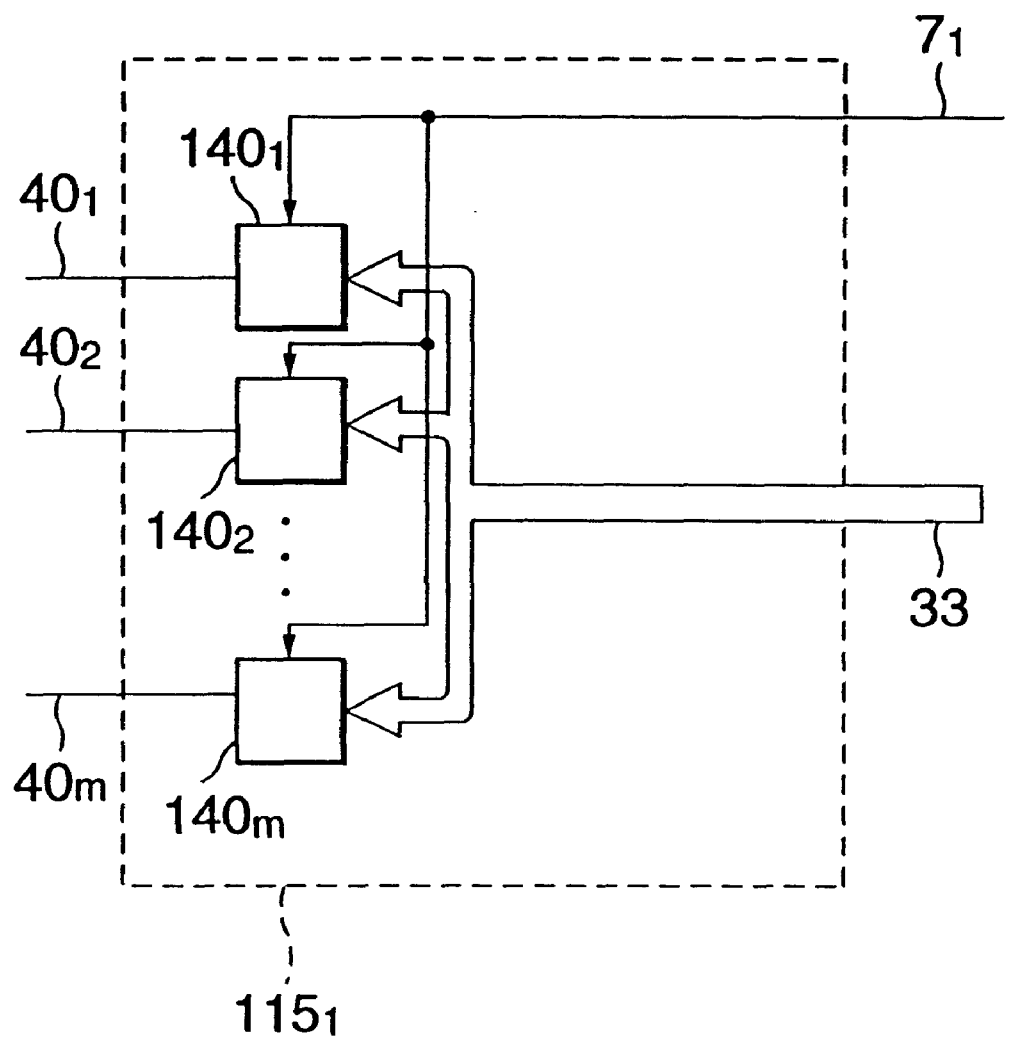
FIG. 2 is a block diagram schematically showing the arrangement of the row decoder 115, in FIG. 1.
Figure 3:
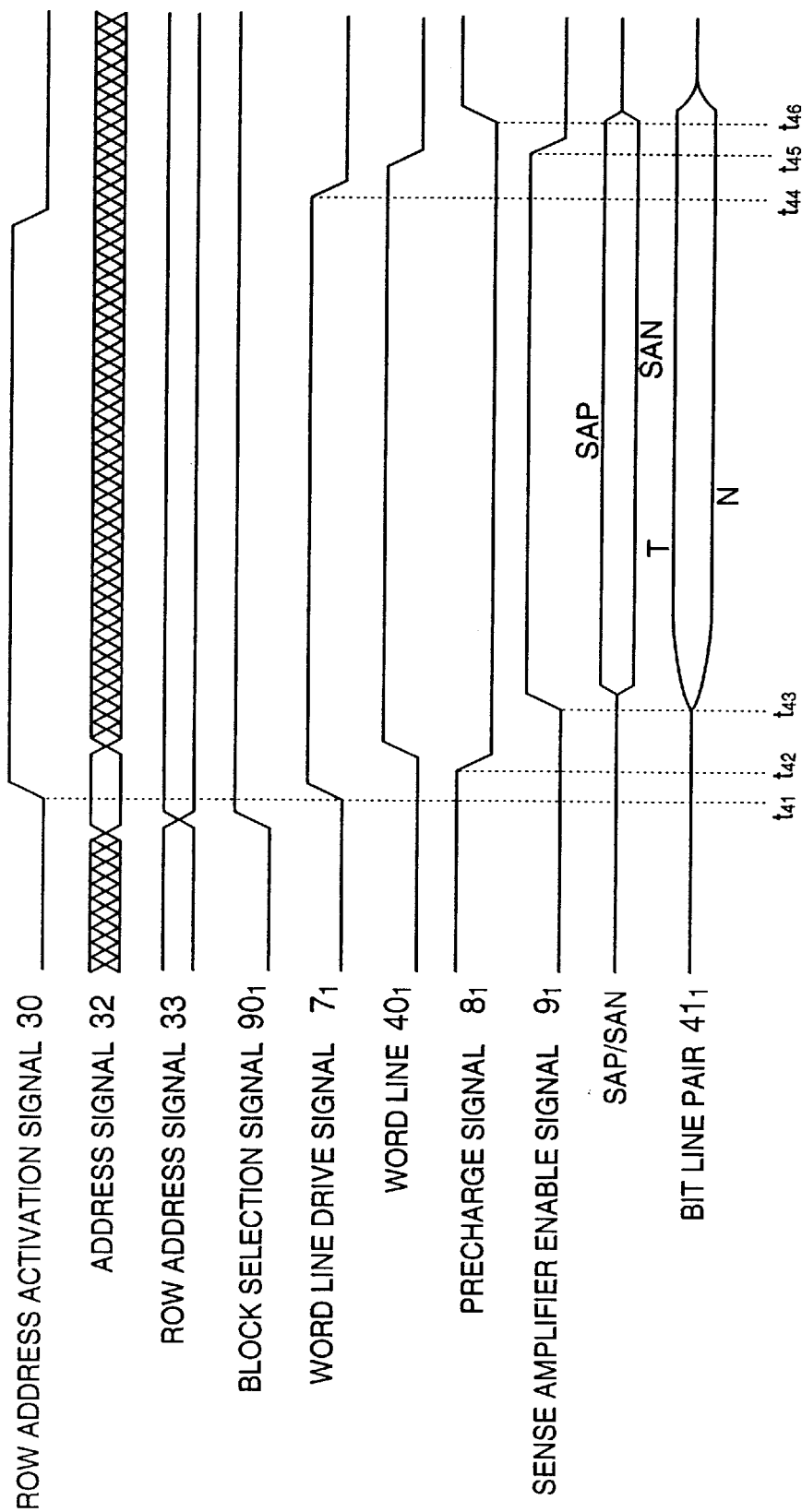
FIG. 3 is a timing chart for explaining operation of the semiconductor memory device shown in FIG. 1.
Figure 4:
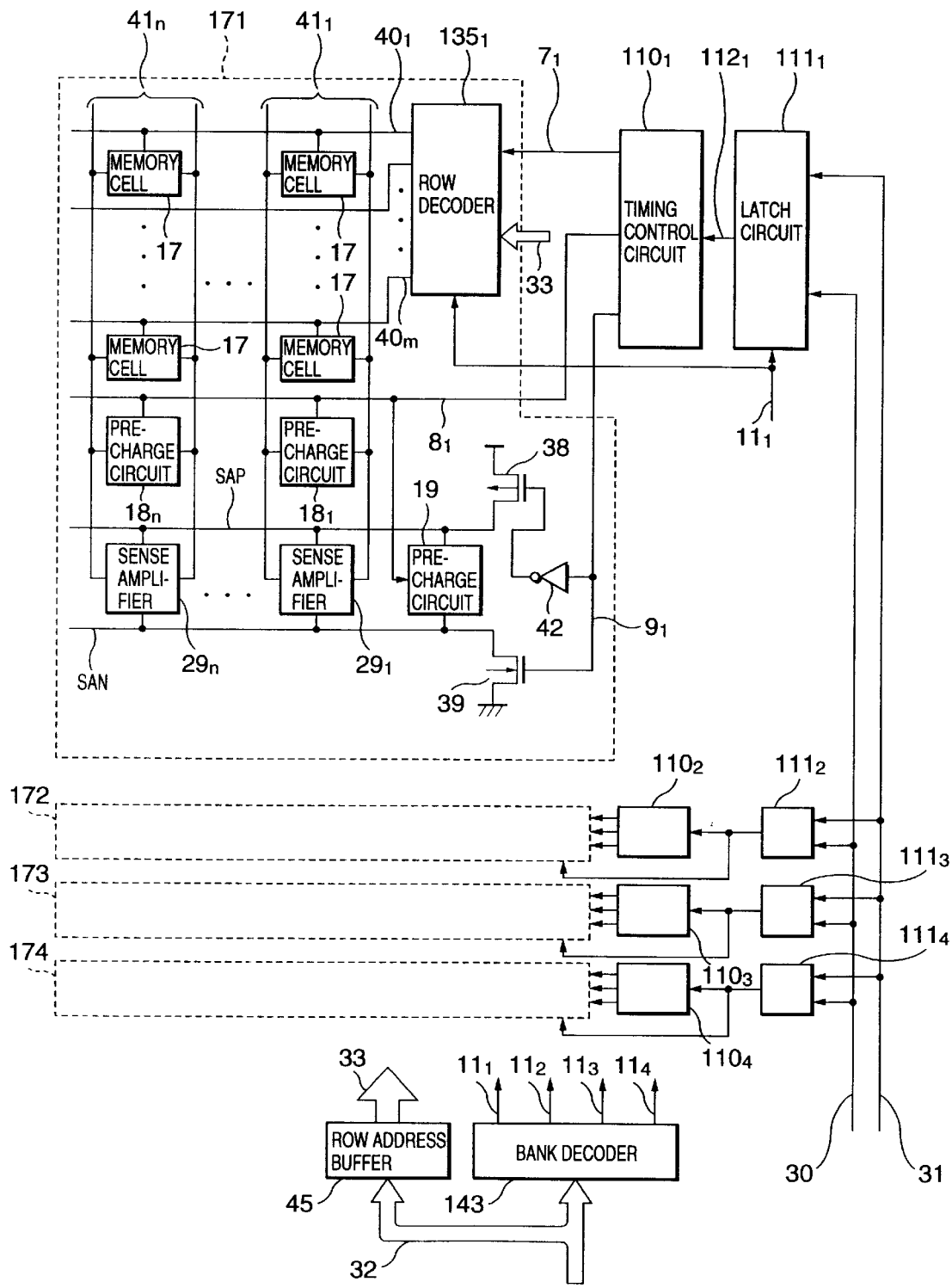
FIG. 4 is a block diagram schematically showing the arrangement of a semiconductor memory device according to the second prior art.
Figure 5:
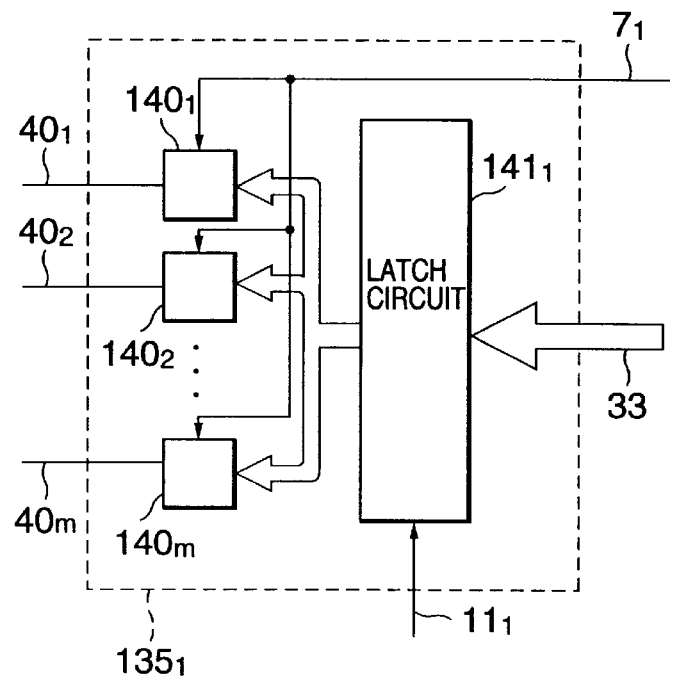
FIG. 5 is a block diagram schematically showing the arrangement of a row decoder $135_1$ in FIG. 4.
Figure 6:
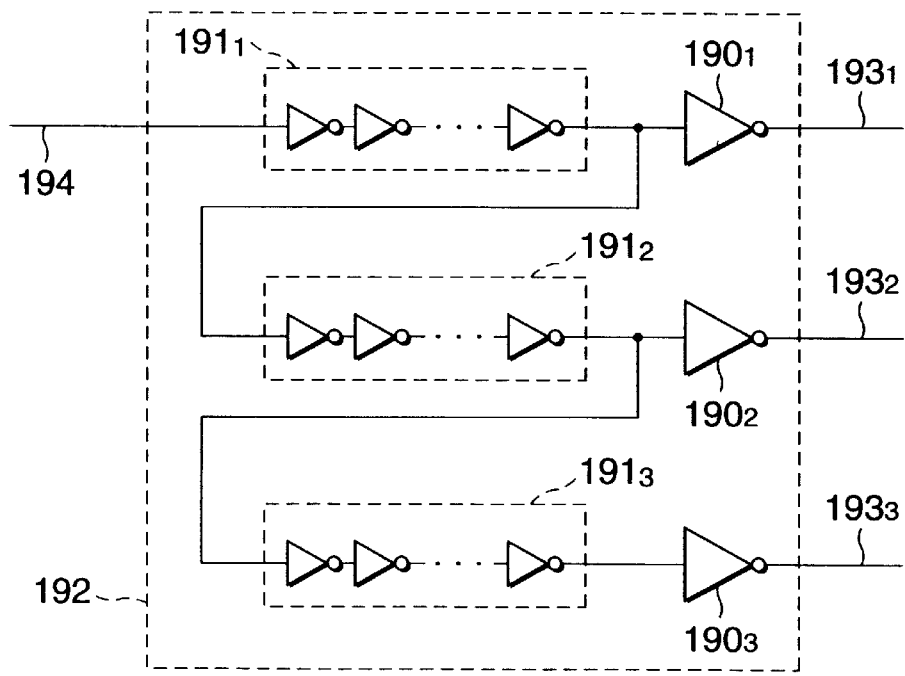
FIG. 6 is a circuit diagram showing the arrangement of a conventional general timing control circuit.

In the banks 1 to 4, row decoders $5_1$ to $5_4$ replace the row decoders $135_1$ to $135_4$ in he banks 171 to 174 in FIG. 4.

Figure 9:
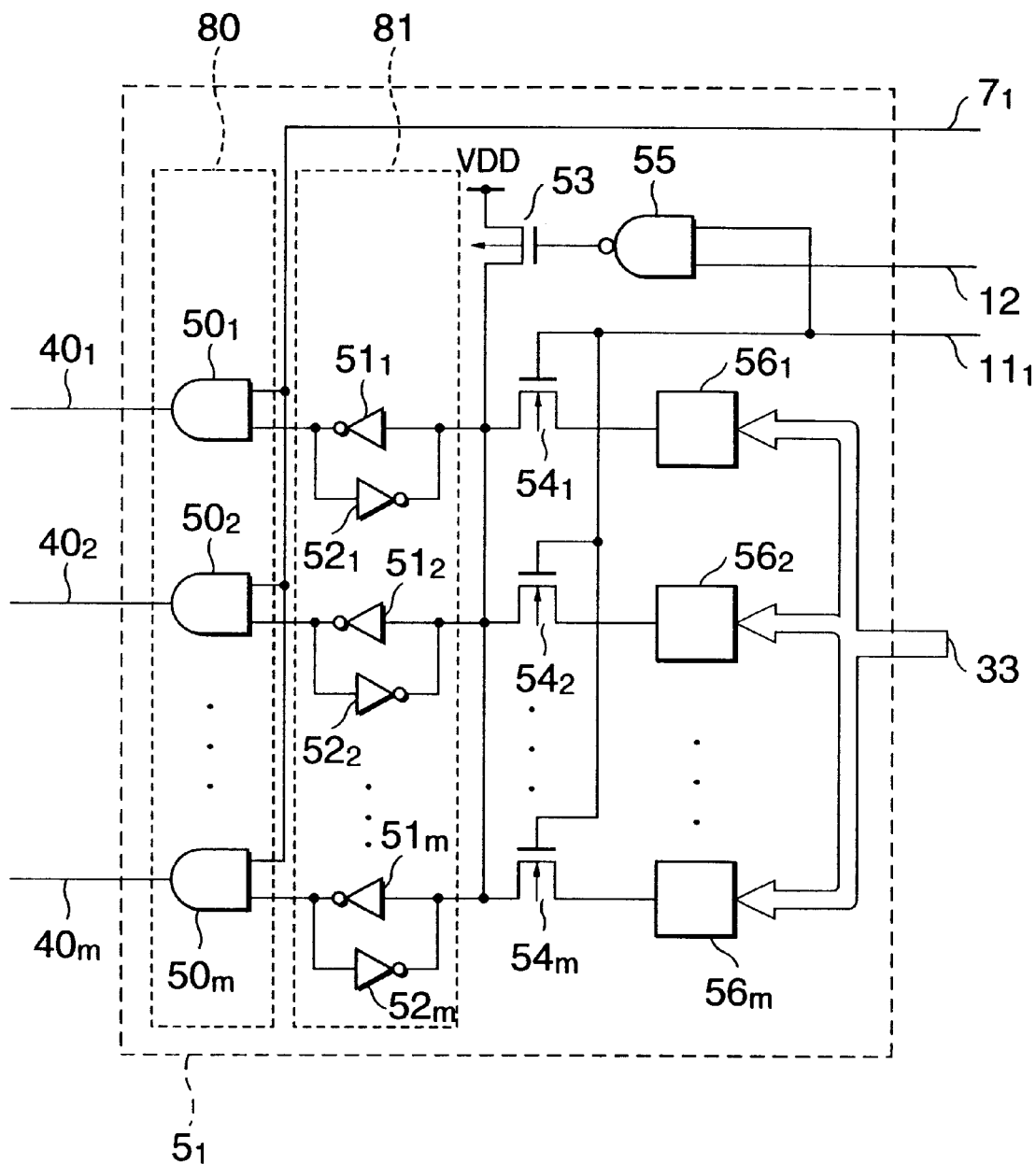
FIG. 9 is a circuit diagram schematically showing the arrangement of a row decoder $5_1$ in FIG. 7.

As shown in FIG. 9, the row decoder $5_1$ is made up of address decoders $56_1$ to $56_m$, n-channel MOS transistors $54_1$ to $54_m$, inverters $51_1$ to $51_m$, inverters $52_1$ to $52_m$, AND circuits $50_1$ to $50_m$, a NAND circuit 55, and a p-channel MOS transistor 53.

In the address decoders $56_1$ to $56_m$, addresses corresponding to word lines $40_1$ to $40_m$ are set. When an address indicated by the row address signal 33 is a set address, each address decoder outputs an L output signal.

The gates of the n-channel MOS transistors $54_1$ to $54_m$ receive the bank selection signal $11_1$, and the drains receive output signals from the address decoders $56_1$ to $56_m$. When the bank selection signal $11_1$ changes to H, the n-channel MOS transistors $54_1$ to $54_m$ output the output signals from the address decoders $56_1$ to $56_m$ to the sources.

The NAND circuit 55 inverts the AND of the word line drive signal reset signal 12 and bank selection signal $11_1$ and outputs the inverted signal.

The gate of the p-channel MOS transistor 53 receives an output signal from the NAND circuit 55. When the output signal from the NAND circuit 55 changes to L, the p-channel MOS transistor 53 is turned on to set the sources of the n-channel MOS transistors $54_1$ to $54_m$ to a voltage VDD.

Pairs of inverters $5_1$ to $5_m$ and $5_2$ to $52_m$ respectively constitute latch circuits, and latch and output the source voltages of the n-channel MOS transistors $54_1$ to $54_m$.

The AND circuits $50_1$ to $50_m$ respectively AND signals latched by the latch circuits constituted by the pairs of inverters $51_1$ to $51_m$ and $52_1$ to $52_m$ and the word line drive signal $7_1$, and output the ANDs to the word lines $40_1$ to $40_m$.

Figure 10:
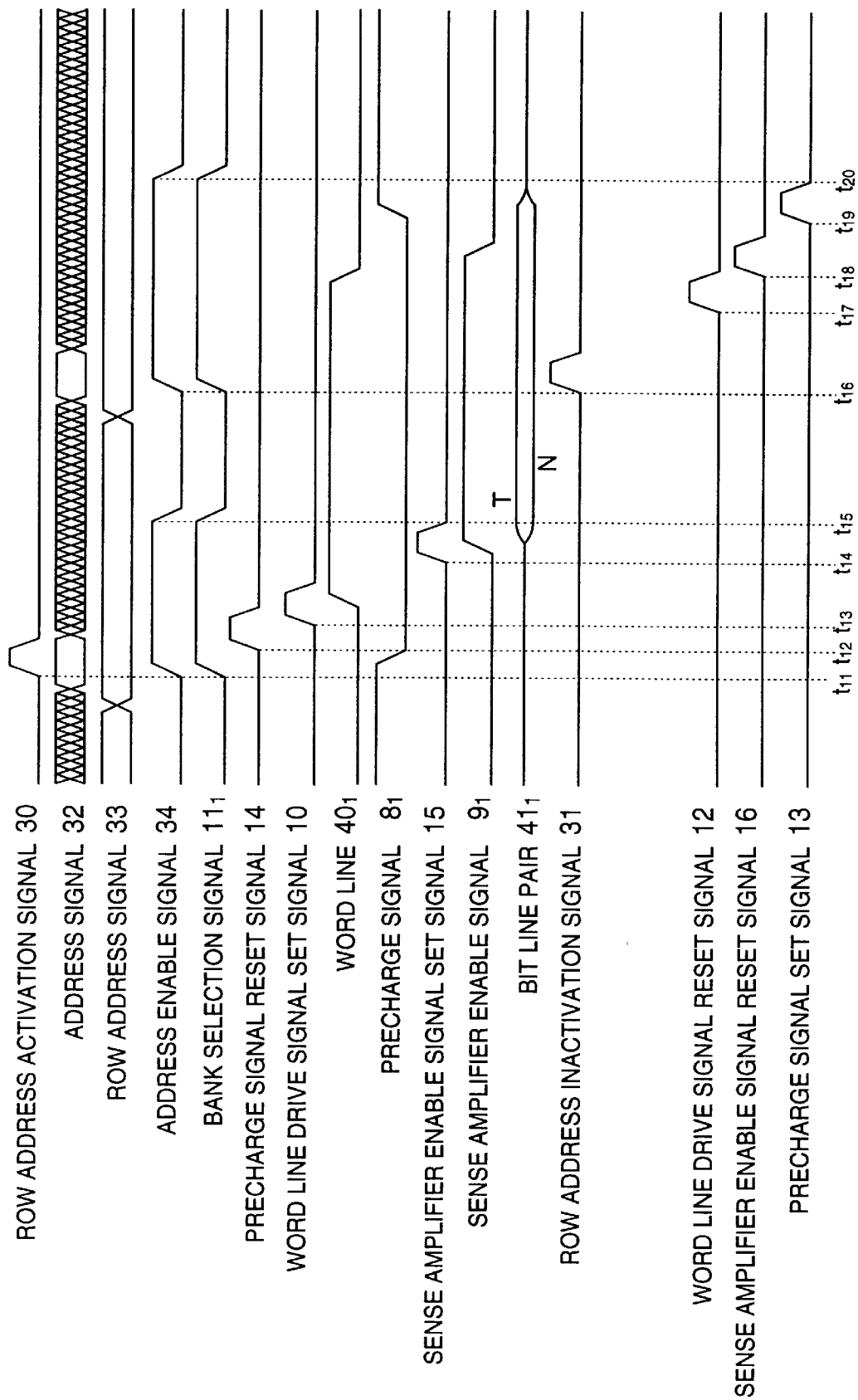
FIG. 10 is a timing chart for explaining operation of the semiconductor memory device shown in FIG. 7.

Operation of the first embodiment will be described with reference to FIGS. 7, 8, and 9 and a timing chart of FIG. 10.

A set sequence of reading out data of a memory cell 17 formed at the intersection of a bit line pair $41_1$ and word line $40_1$ in the bank 1 will be explained.

At $t_{11}$, when an external command is externally input, and the address signal 32 including a row address indicating the address of the word line $40_1$ and a bank address indicating the bank 1 is input, the row address activation signal 30 is activated for a predetermined period.

Since the row address activation signal 30 becomes active, the timing control circuit 35 activates the address enable signal 34 for a predetermined period. Upon reception of the address signal 32, the row address buffer 45 outputs the row address signal 33, and the bank decoder 43 activates the bank selection signal $11_1$ for a predetermined period.

At $t_{12}$, the active timing chain 37 of the timing control circuit 35 activates the precharge signal reset signal 14 for a predetermined time. At this time, since the bank selection signal $11_1$ is active, the flip-flop circuit 21 of the latch circuit $6_1$ is reset, and the precharge signal $8_1$ changes from H to L. Then, the precharge circuits $18_1$ to $18_n$ and 19 stop precharging.

At $t_{13}$, the active timing chain 37 activates the word line drive signal set signal 10 for a predetermined period. At this time, since the bank selection signal $11_1$ is active, the flip-flop circuit 20 of the latch circuit $6_1$ is set, and the word line drive signal $7_1$ changes from L to H. In the row decoder $5_1$, since the row address signal 33 indicates the address of the word line $40_1$, the address decoder $56_1$ outputs an active L output signal. Since the bank selection signal $11_1$ is at H, the n-channel MOS transistor $54_1$ is turned on, and the L output signal from the address decoder $56_1$ is input to the inverter $51_1$. As a result, an H signal is input to the AND circuit $50_1$. Since the word line drive signal $7_1$ is at H, the word line $40_1$ is activated. Since the word line drive signal reset signal 12 is at L, the NAND circuit 55 outputs an H output signal, and the p-channel MOS transistor 53 is kept off.

At $t_{14}$, the active timing chain 37 activates the sense amplifier enable signal set signal 15 for a predetermined period. Since the bank selection signal $11_1$ is active, the flip-flop circuit 22 is set, and the sense amplifier enable signal $9_1$ changes to H. Then, the memory contents of the memory cell 17 output to the bit line pair $41_1$ are amplified and output. At $t_{15}$, the bank selection signal $11_1$ changes to L to complete the set sequence.

A reset sequence of inactivating the bank 1 upon completion of a read of data from the memory cell 17 will be explained.

At $t_{15}$, the row address inactivation signal 31 is activated from the above state for a predetermined period. By the same operation as that of a read, the address enable signal 34 becomes active for a predetermined period, and the bank selection signal $11_1$ also becomes active for a predetermined period. The precharge timing chain 36 of the timing control circuit 35 activates the word line drive signal reset signal 12 for a predetermined period. Then, the flip-flop circuit 20 of the latch circuit $6_1$ is reset, the word line drive signal $7_1$ changes to L, and the word line $40_1$ is inactivated.

At $t_{17}$, the precharge timing chain 36 activates the sense amplifier enable signal reset signal 16 for a predetermined period. Accordingly, the flip-flop circuit 22 of the latch circuit $6_1$ is reset, the sense amplifier enable signal $9_1$ changes to L, and sense amplifiers $29_1$ to $29_n$ are turned off.

At $t_{18}$, the precharge timing chain 36 activates the precharge signal set signal 13 for a predetermined period. The flip-flop circuit 21 of the latch circuit $6_1$ is set, the precharge signal $8_1$ changes to H, and the precharge circuits $18_1$ to $18_n$ and 19 start precharging. At $t_{19}$, the bank selection signal $11_1$ changes to L to complete the reset sequence.

Figure 11:
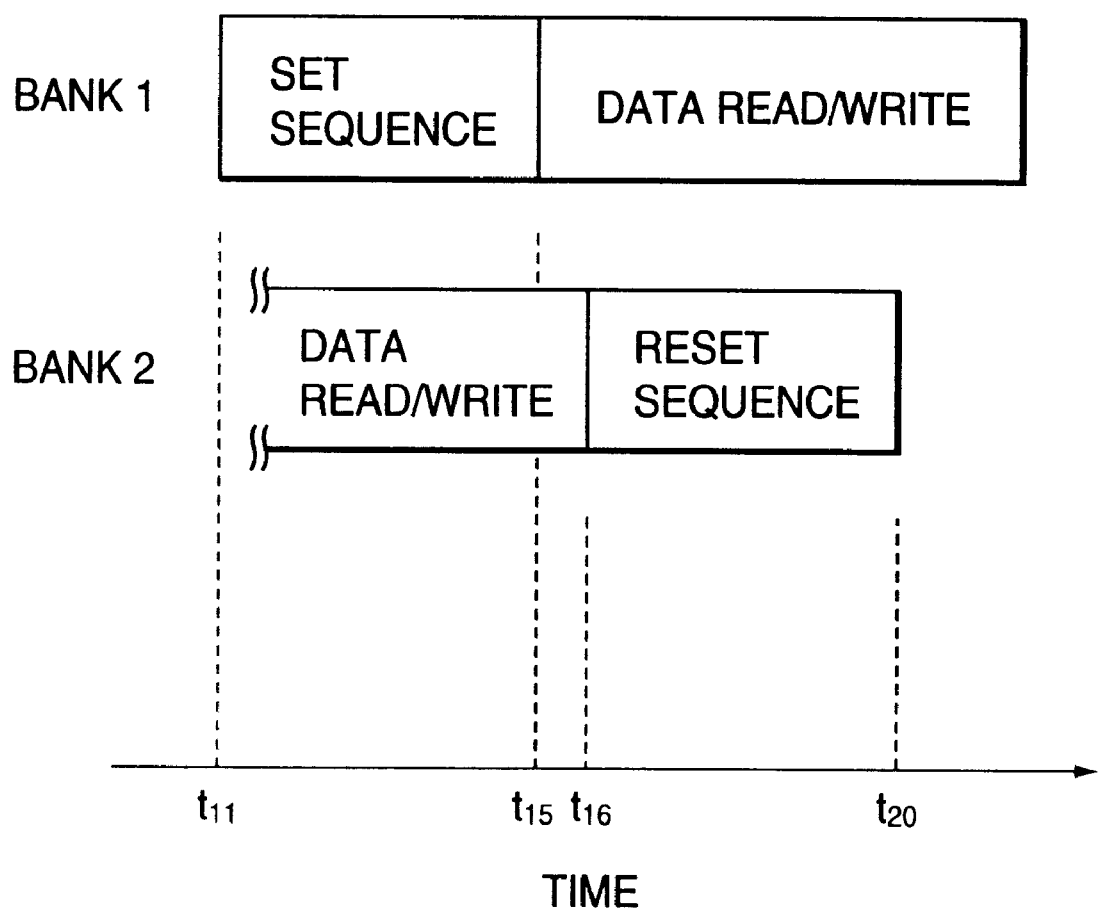
FIG. 11 is a timing chart for explaining the timings of a set sequence for a bank 1 and a reset sequence for a bank 2 in the semiconductor memory device shown in FIG. 7.

In the semiconductor memory device according to the first embodiment, a command by a signal output from the timing control circuit 35 is latched by the latch circuits $6_1$ to $6_4$ respectively arranged for the banks 1 to 4. As shown in FIG. 11, for example, while the set operation for the bank 1 is performed, the reset sequence for the bank 2 can be performed even before completion of a read/write in the bank 1, similar to the conventional semiconductor memory device in FIG. 4.

As described above, in the first embodiment, one timing control circuit 35 can control the operations of the banks 1 to 4 independently of each other. Even if the number of banks increases, one timing control circuit 35 having a large circuit area suffices by arranging a latch circuit for the added bank. Therefore, the circuit area of the timing control circuit can be prevented from being increased by an increase in the number of banks.

A semiconductor memory device according to the second embodiment of the present invention will be described.

Figure 12:
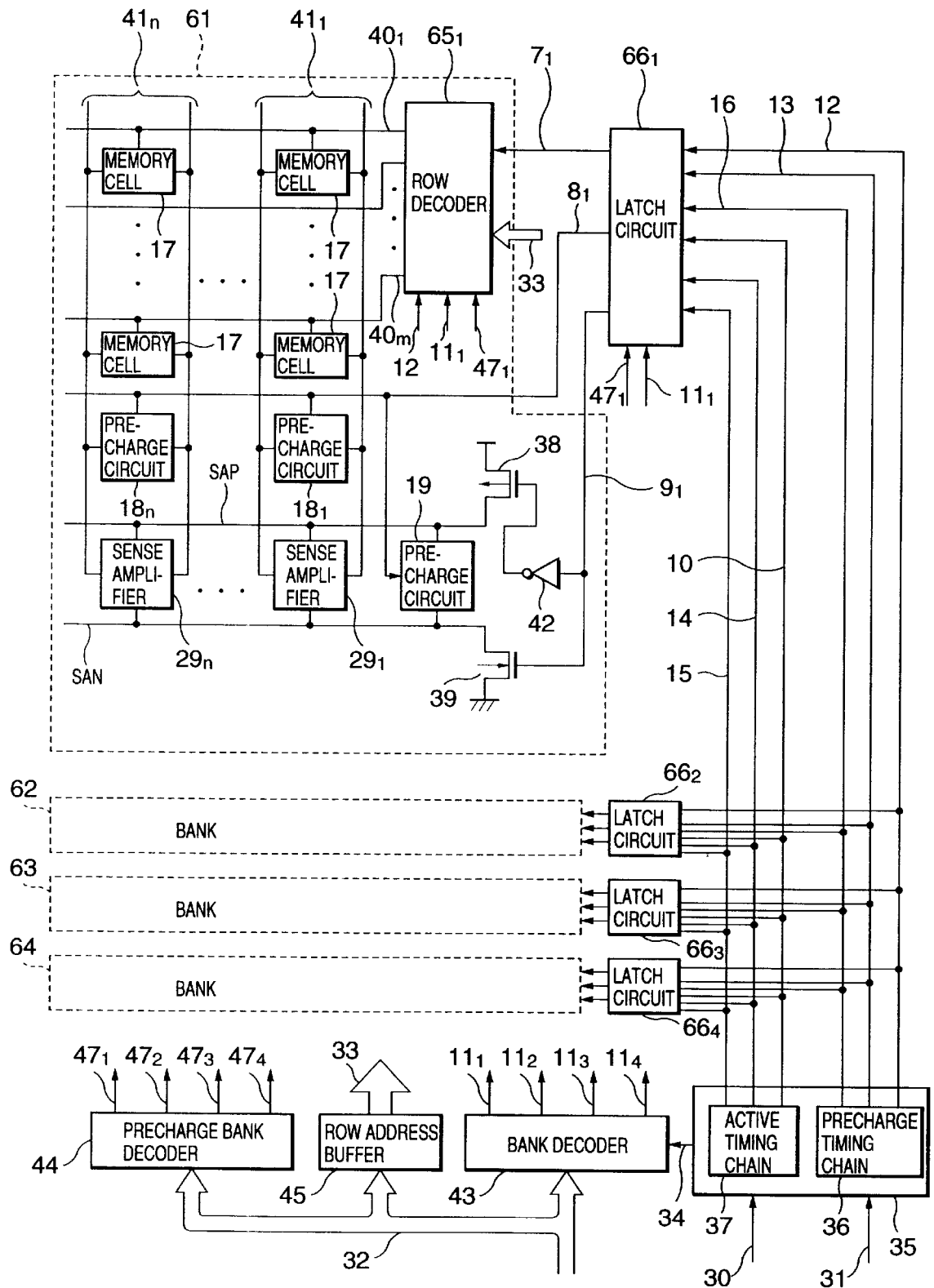
FIG. 12 is a block diagram schematically showing the arrangement of a semiconductor memory device according to the second embodiment of the present invention.

FIG. 12 is a block diagram showing the arrangement of the semiconductor memory device according to the second embodiment. The same reference numerals as in FIG. 7 denote the same parts.

The semiconductor memory device of the second embodiment is different from the semiconductor memory device of the first embodiment shown in FIG. 7 in that latch circuits $66_1$ to $66_4$ replace the latch circuits $6_1$ to $6_4$, banks 61 to 64 replace the banks 1 to 4, and a precharge bank decoder 44 is newly added. That is, the active bank and precharge bank operate independently.

The precharge bank decoder 44 changes, to H, precharge bank selection signals $47_1$ to $47_4$ corresponding to banks indicated by precharge bank addresses which are included in an address signal 32 and designate banks to be precharged.

Compared to the latch circuits $6_1$ to $6_4$, the latch circuits $66_1$ to $66_4$ respectively receive the precharge bank selection signals $47_1$ to $47_4$. If the precharge bank selection signals $47_1$ to $47_4$ are at H even while bank selection signals $11_1$ to $11_4$ are kept at L, when a word line drive signal reset signal 12, a precharge signal reset signal 14, and a sense amplifier enable signal reset signal 16 change to H, flip-flop circuits 20 to 22 are reset.

Figure 13:
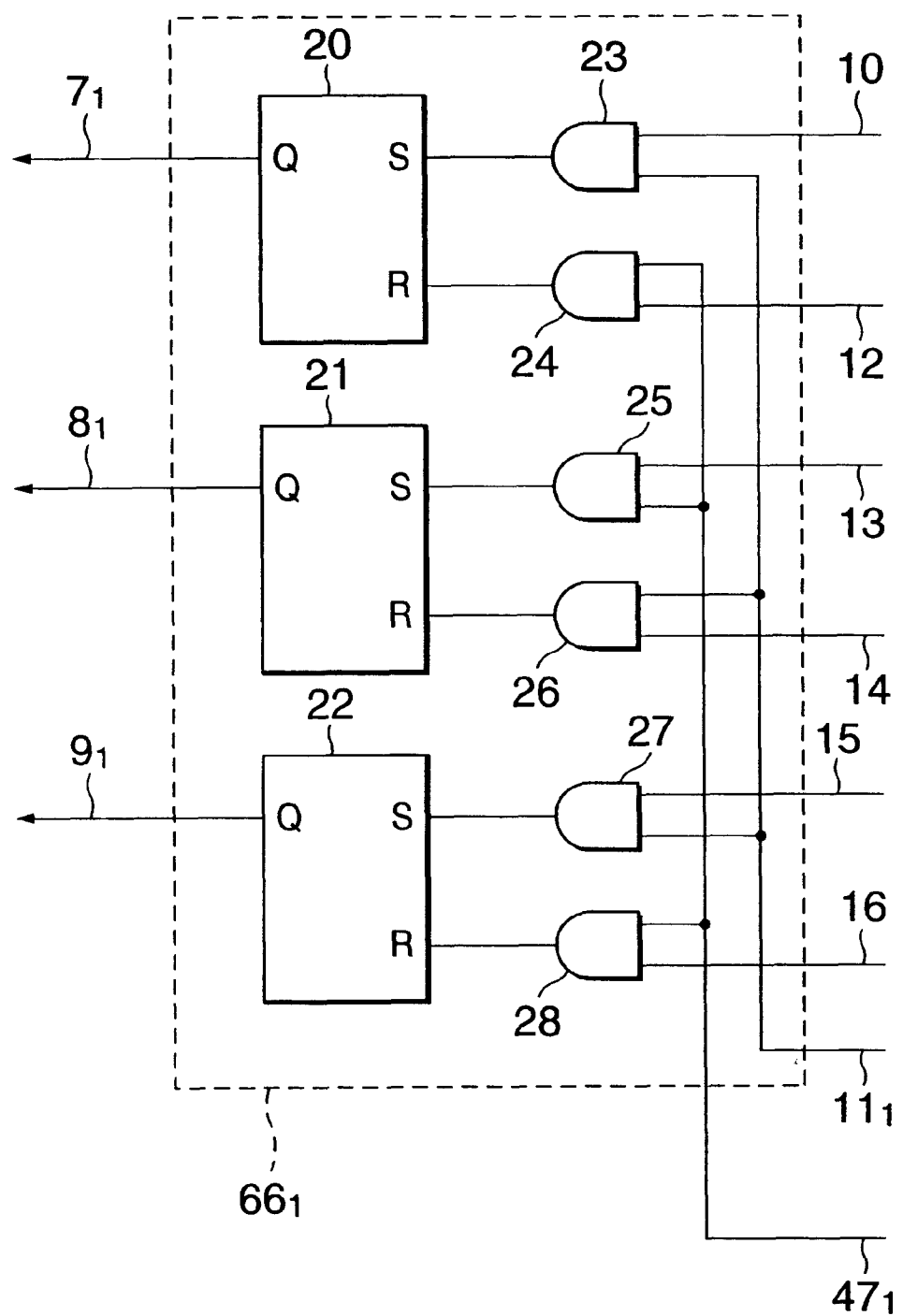
FIG. 13 is a circuit diagram schematically showing the arrangement of a latch circuit $66_1$ in FIG. 12.

As shown in FIG. 13, each of the latch circuits $66_1$ to $66_4$ receives the precharge bank selection signal $47_1$ in place of the bank selection signal $11_1$ input to the AND circuits 24, 25, and 28 in each of the latch circuits $6_1$ to $6_4$ shown in FIG. 8.

In the banks 61 to 64, row decoders $65_1$ to $65_4$ respectively replace the row decoders $5_1$ to $5_4$ for the banks 1 to 4.

Figure 14:
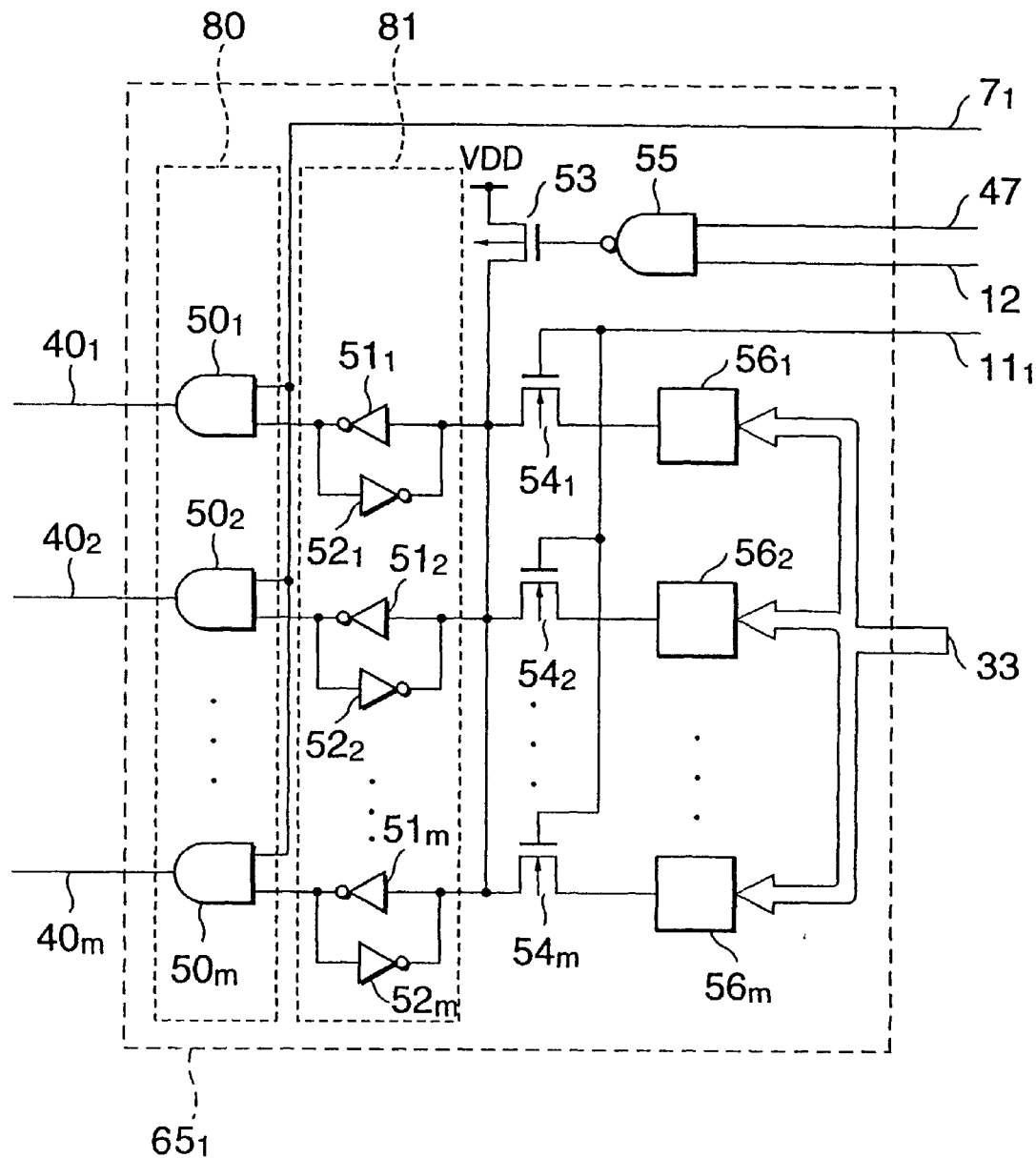
FIG. 14 is a circuit diagram schematically showing he arrangement of a row decoder $65_1$ in FIG. 12.

As shown in FIG. 14, in the row decoders $65_1$ to $65_4$, compared to the row decoders $5_1$ to $5_4$, a NAND circuit 55 outputs the NAND of the word line drive signal reset signal 12 and precharge bank selection signal $47_1$.

Operation of the second embodiment will be explained with reference to FIGS. 12 to 16.

Figure 15:
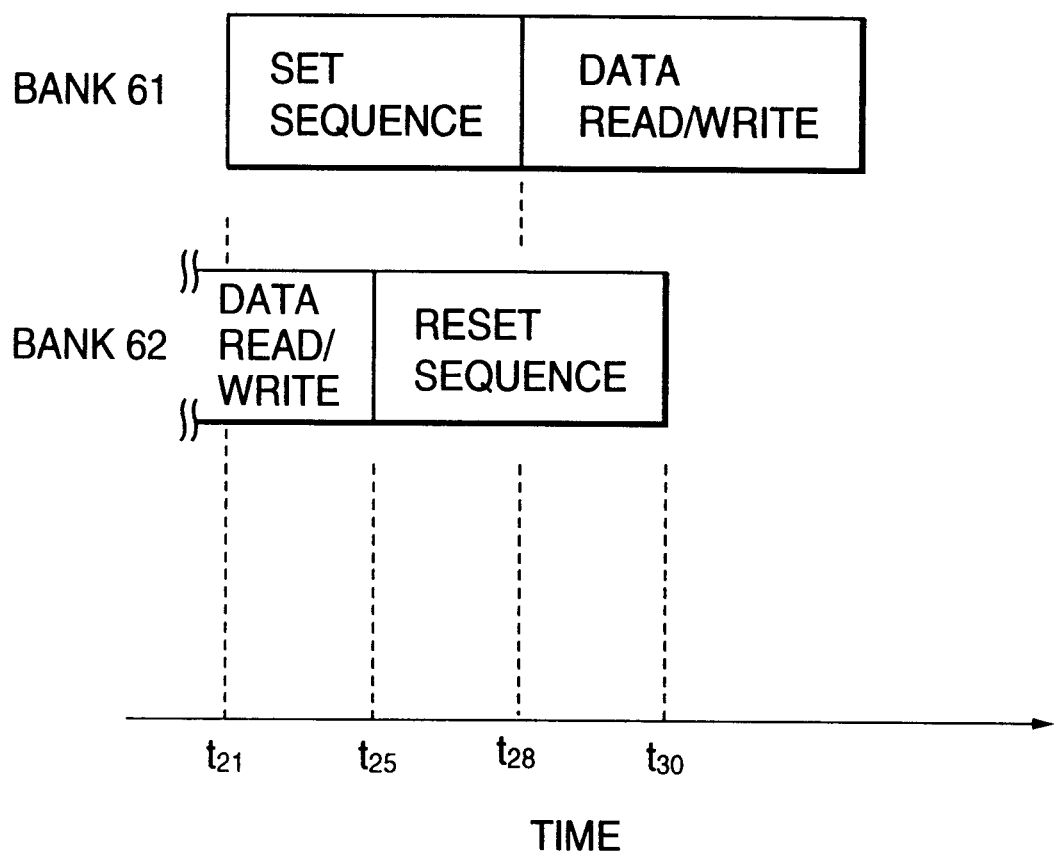
FIG. 15 is a timing chart for explaining the timings of a set sequence for a bank 61 and a reset sequence for a bank 62 in the semiconductor memory device shown in FIG. 12.

As shown in FIG. 15, the case in which a reset sequence for the bank 62 starts during a set sequence for the bank 61 will be explained.

Figure 16:
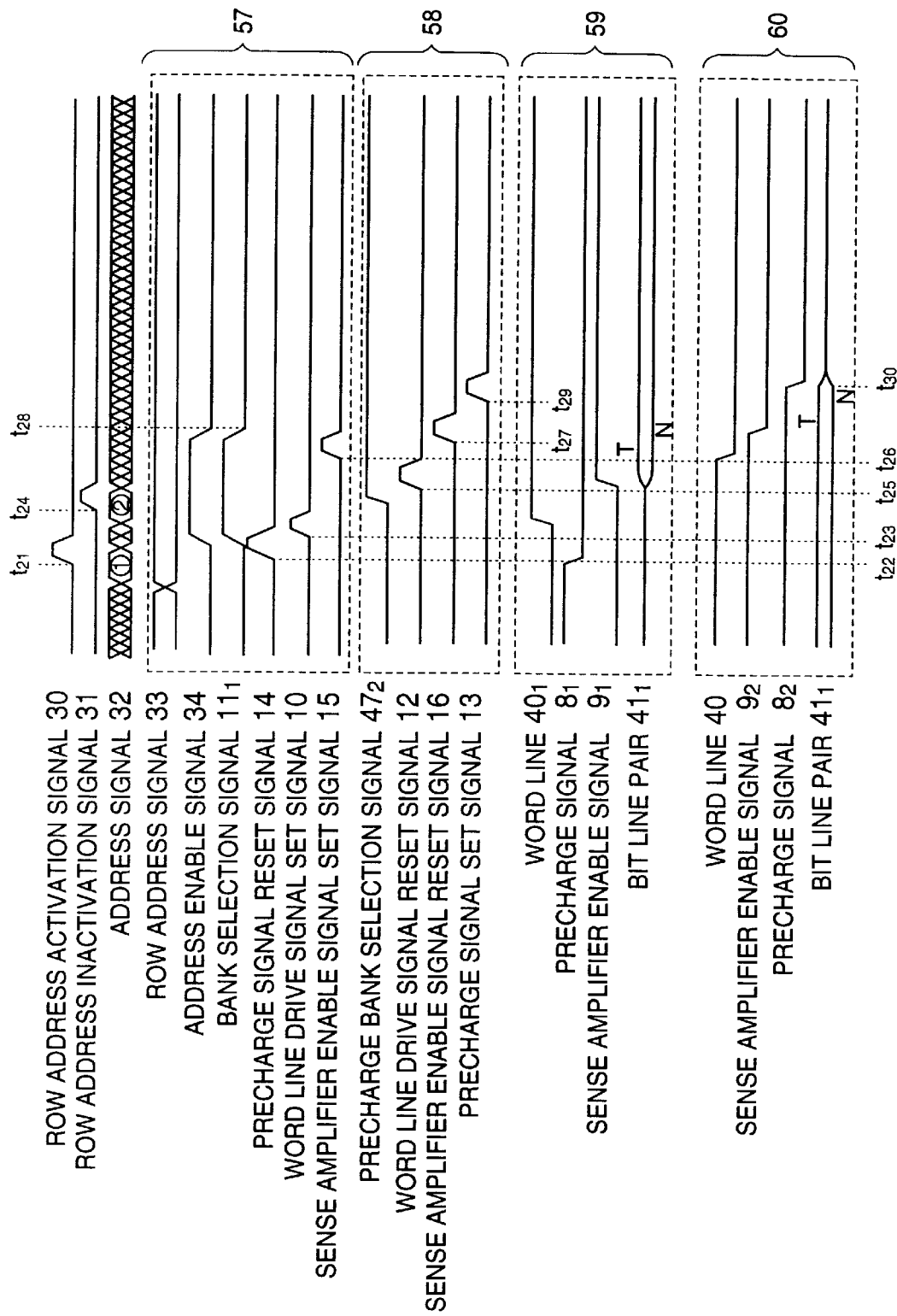
FIG. 16 is a timing chart for explaining operation of the semiconductor memory device shown in FIG. 12.

At $t_{21}$, the row address activation signal 30 becomes active, and a timing control circuit 35 activates an address enable signal 34. Then, a bank decoder 43 changes the bank selection signal $11_1$ to H, and a row address buffer 45 outputs the row address included in the address signal 32 as a row address signal 33. Portion ① of the address signal 32 in the timing chart of FIG. 16 represents the row address read as the row address signal 33. An active timing chain 37 of the timing control circuit 35 changes, to H, a precharge signal reset signal 14 at $t_{22}$, a word line drive signal set signal 10 at $t_{23}$, and a sense amplifier enable signal set signal 15 at $t_{26}$ at predetermined timings for a predetermined period. This operation is represented by an active sequence 57 in the timing chart of FIG. 16. At $t_{28}$, the bank selection signal $11_1$ changes to L to complete the set sequence.

In the bank 61, at $t_{22}$, since the precharge signal reset signal 14 and bank selection signal $11_1$ are changed to H by the above operation, the flip-flop circuit 21 is reset in the latch circuit $66_1$ to change a precharge signal $8_1$ to L. At $t_{23}$, since the word line drive signal set signal 10 changes to H, a word line drive signal $7_1$ changes to H, the word line drive signal $7_1$ changes to H, and a word line $40_1$ is activated by the row decoder $65_1$. At $t_{26}$, since the sense amplifier enable signal set signal 15 changes to H, a sense amplifier enable signal $9_1$ changes to H. At $t_{28}$, the selection signal $11_1$ changes to H to complete the active sequence for the bank 61. This operation is represented by an internal signal 59 of the bank 61 in the timing chart of FIG. 16.

During the active sequence in the bank 61, the bank address in the address signal 32 changes to designate the bank 62 and activate a row address inactivation signal 31. Portion ② of the address signal 32 in FIG. 16 represents the changed bank address and row address. Then, the precharge bank decoder 44 changes the precharge bank selection signal $47_2$ to H. A precharge timing chain 36 of the timing control circuit 35 changes, to H, the word line drive signal reset signal 12 at $t_{25}$, the sense amplifier enable signal reset signal 16 at $t_{27}$, and the precharge signal set signal 13 at $t_{29}$ at predetermined timings for a predetermined period. This operation is represented by a reset sequence 58 in the timing chart of FIG. 16.

Since both the word line drive signal reset signal 12 and precharge bank selection signal $47_2$ are changed to H by the above operation, the flip-flop circuit 20 is reset in the latch circuit $66_2$ to chance a word line drive signal $7_2$ to L. Accordingly, the row decoder $65_2$ (not shown) arranged in the bank 62 inactivates a word line $40_1$ in the bank 62. Since both the sense amplifier enable signal reset signal 16 and precharge bank selection signal $47_2$ change to H, the flip-flop circuit 22 in the latch circuit $66_2$ is reset to change the sense amplifier enable signal $9_2$ to L. Since the precharge signal set signal 13 changes to H, the flip-flop circuit 21 in the latch circuit $66_2$ 2 is set to change a precharge signal $8_2$ to H, thereby completing the reset sequence for the bank 62. This operation is represented by an internal signal 60 of the bank 62 in the timing chart of FIG. 16.

In the second embodiment, arranging the precharge bank decoder 44 allows performance of the set sequence and reset sequence for different banks parallel to each other. That is, since data of a given bank can be read out while the reset sequence for another bank is performed, the processing speed increases. These sequences cannot simultaneously start because the address signal 32 is used to designate both a bank subjected to the set sequence and a bank subjected to the reset sequence. However, if a precharge address signal for designating the address of a bank to be precharged is set in addition to the address signal 32 to independently control the row address activation signal 30 and row address inactivation signal 31 by different commands, the set sequence and reset sequence can be operated completely independently. In other words, the set sequence and reset sequence can be simultaneously performed.

A signal corresponding to the address enable signal 34 in synchronism with the row address inactivation signal 31 may be input to the precharge bank decoder 44 to mask a decoded output.

A semiconductor memory device according to the third embodiment of the present invention will be described.

Figure 17:
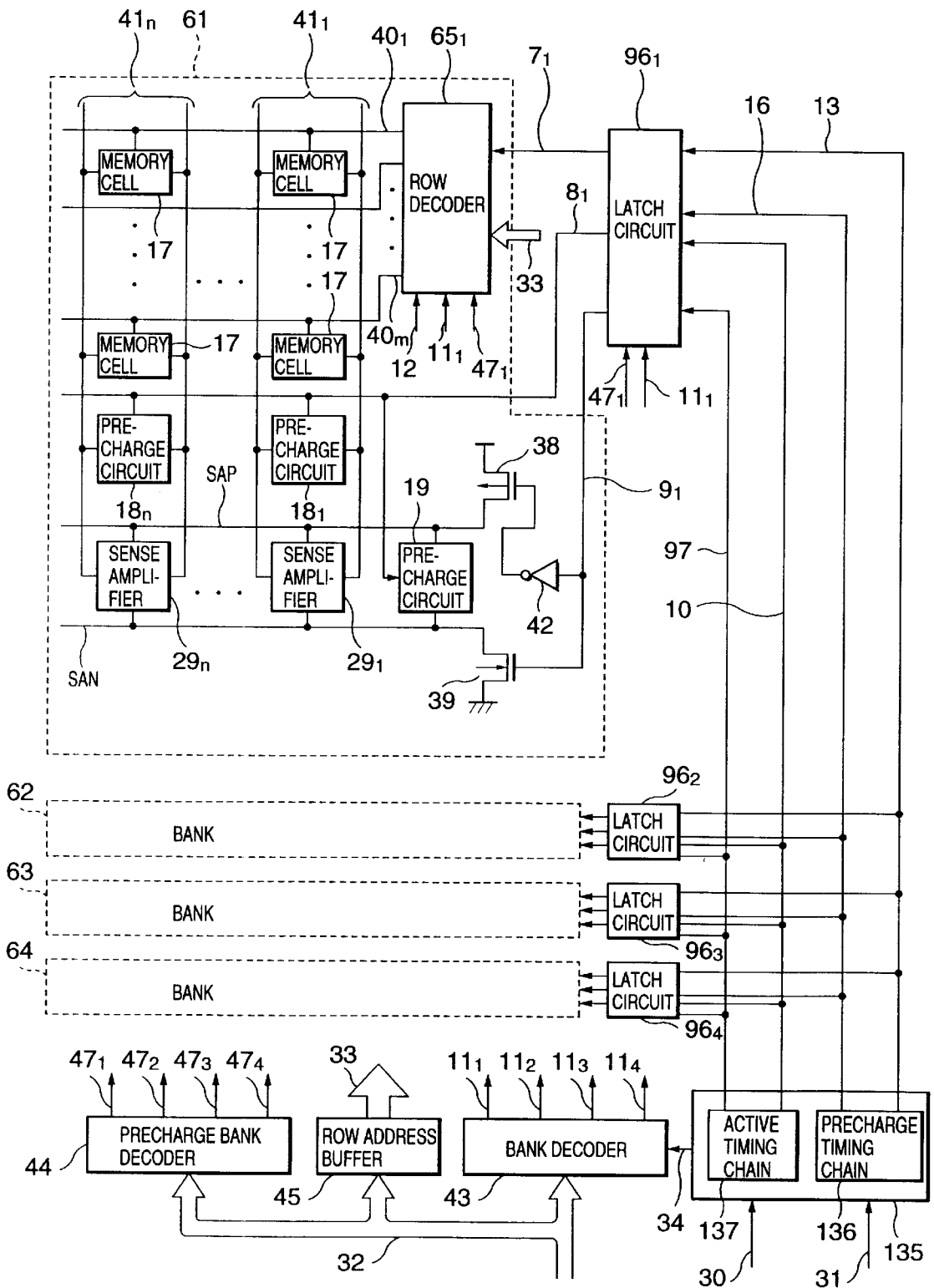
FIG. 17 is a block diagram schematically showing the arrangement of a semiconductor memory device according to the third embodiment of the present invention.

FIG. 17 is a block diagram showing the arrangement of the semiconductor memory device according to the third embodiment. The same reference numerals as in FIG. 12 denote the same parts.

The semiconductor memory device of the third embodiment is different from the semiconductor memory device of the second embodiment in FIG. 12 in that latch circuits $96_1$ to $96_4$ replace the latch circuits $66_1$ to $66_4$, and a timing control circuit 135 replaces the timing control circuit 35.

In the timing control circuit 135, an active timing chain 137 replaces the active timing chain 37 in the timing control circuit 35, and a precharge timing chain 136 replaces the precharge timing chain 36.

Operation of the active timing chain 137 is the same as that of the active timing chain 37 except that the active timing chain 137 does not output any precharge signal reset signal 14 and sense amplifier enable signal set signal 15 but outputs a sense enable signal 97 as a signal for controlling the output timing of a sense amplifier enable signal $9_1$.

In the third embodiment, an address enable signal 34 is activated only when a row address activation signal 30 is active, and is not output when a row address inactivation signal 31 is active. Bank selection signals $11_1$ to $11_4$ are output in synchronism with the address enable signal 34. In the reset sequence, however, they need not be synchronized with the address enable signal 34 because a margin exists before a sense amplifier enable signal reset signal 16 and a precharge signal set signal 13 are activated after the address inactivation signal 31 becomes active. For this reason, in the third embodiment, the address enable signal 34 is output only in the active sequence.

Operation of the precharge timing chain 136 is the same as that of the precharge timing chain 36 except that the precharge timing chain 136 does not output any word line drive signal reset signal 12.

Figure 18:
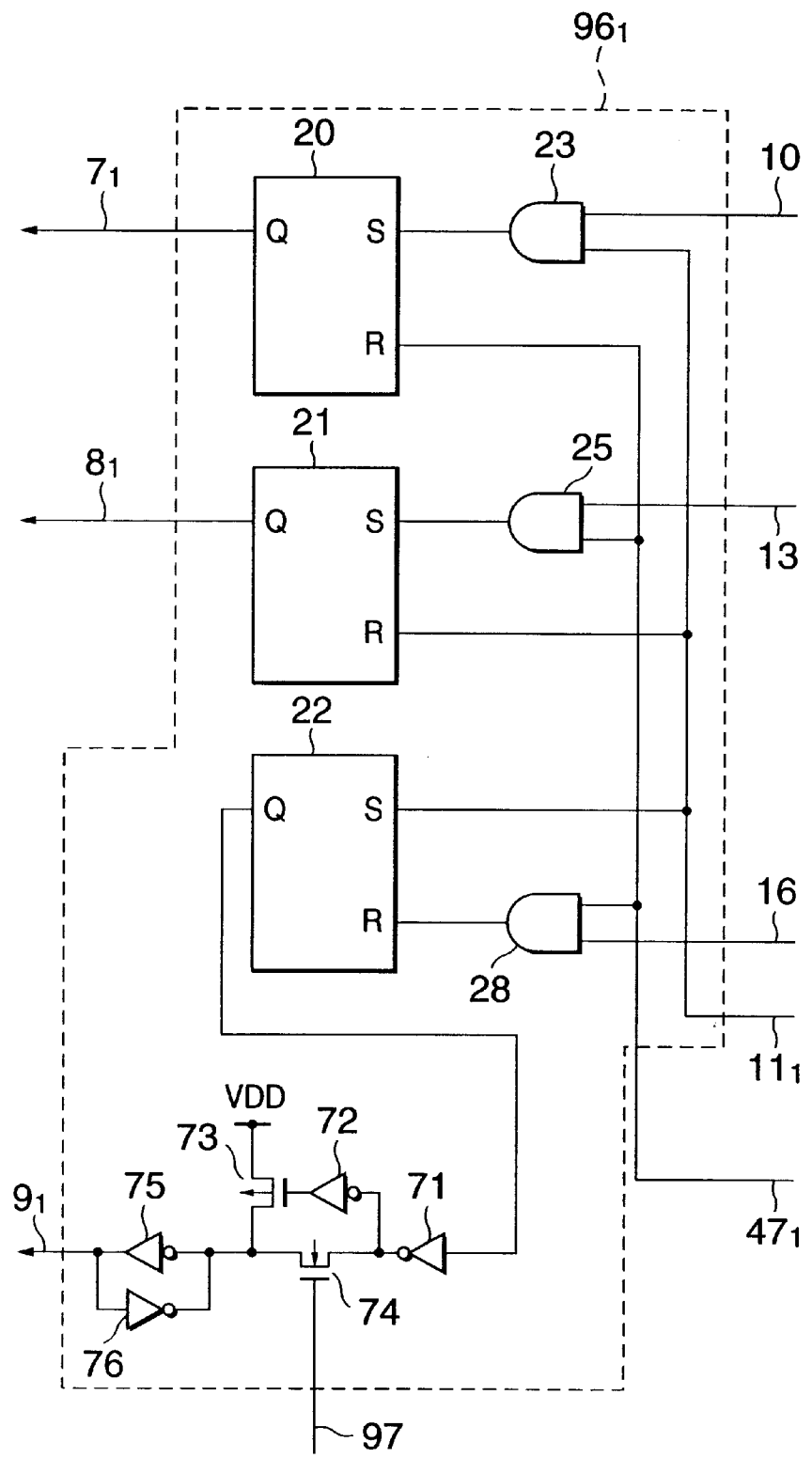
FIG. 18 is a block diagram schematically showing the arrangement of a latch circuit $96_1$ in FIG. 17.

As shown in FIG. 18, in the latch circuits $96_1$ to $96_4$, compared to the latch circuits $66_1$ to $66_4$ in the second embodiment, the sense enable signal 97 is input, and the AND circuits 24, 26, and 27 are eliminated. When the bank selection signal $11_1$ changes to H, a flip-flop circuit 21 is reset, and a flip-flop circuit 22 is set. When a precharge bank selection signal $47_1$ changes to H, a flip-flop circuit 20 is reset. Each of the latch circuits $96_1$ to $96_4$ additionally comprises inverters 71, 72, 75, and 76, a p-channel MOS transistor 73, and an n-channel MOS transistor 74.

The inverter 71 inverts an output signal from the flip-flop circuit 22 and outputs the inverted signal.

The gate of the n-channel MOS transistor 74 receives the sense enable signal 97, and thus drain is connected to the output of the inverter 71. When the sense enable signal 97 changes to H, the n-channel MOS transistor 74 is turned on to output an output signal from the inverter 71 to the source. The inverter 72 inverts an output signal from the inverter 71 and outputs the inverted signal to the gate of the p-channel MOS transistor 73.

When an output signal from the inverter 72 changes to L, the p-channel MOS transistor 73 is turned on to set the source of the n-channel MOS transistor 74 to a voltage VDD.

The inverters 75 and 76 constitute a latch circuit, which latches a voltage output to the source of the n-channel MOS transistor 74 and outputs it as a sense amplifier enable signal $9_1$.

Operation of the third embodiment will be explained with reference to FIGS. 17 and 18 and a timing chart of FIG. 19.

A set sequence of reading out data of a memory cell 17 formed at the intersection of a bit line pair $41_1$ and word line $40_1$ in a bank 61 will be explained.

At $t_{31}$, the row address activation signal 30 becomes active for a predetermined period, and the timing control circuit 135 activates an address enable signal 34. Then, a bank decoder 43 changes the bank selection signal $11_1$ to H, and a row address buffer 45 outputs a row address signal 33. This operation is the same as in the first and second embodiments. The active timing chain 137 of the timing control circuit 135 changes, to H, a word line drive signal set signal 10 at $t_{32}$ and the sense enable signal 97 at $t_{33}$.

At $t_{31}$, since the bank selection signal $11_1$ changes to H, the flip-flop circuit 21 of the latch circuit $96_1$ is reset to change a precharge signal $8_1$ to L.

At $t_{32}$, since the word line drive signal set signal 10 changes to H, the flip-flop circuit 20 of the latch circuit $96_1$ is set to change a word line drive signal $7_1$ to H.

At $t_{33}$, since the sense enable signal 97 is at H, the n-channel MOS transistor 74 is turned on. At this time, since the bank selection signal $11_1$ is at H, and the flip-flop circuit 22 is set, the flip-flop circuit 22 outputs an H output signal, as shown in FIG. 19. Accordingly, the inverter 71 outputs an L output signal, and the source of the n-channel MOS transistor 74 receives the L signal. This L signal is latched by the inverters 75 and 76, and its logic is inverted to H. The H signal is output as a sense amplifier enable signal $9_1$.

A reset sequence operation will be described.

Operation of the semiconductor memory device of the third embodiment is the same as that of the second embodiment described above except that the precharge timing chain 136 for outputting a reset sequence signal does not output any word line drive signal reset signal 12. A description of the common operation will be omitted.

In the latch circuit $96_1$ of tie third embodiment, the flip-flop circuit 20 is reset by the precharge bank selection signal $47_1$ instead of the word line drive signal reset signal 12, thereby changing the word line drive signal $7_1$ to L.

The third embodiment uses only four signals output from the timing control circuit 135 to the latch circuits $96_1$ to $96_4$. As a result, the number of interconnections decreases, the number of circuits for generating different timing signals in the timing control circuit 135 decreases, and thus the circuit area is reduced. Further, the timing design can be simplified because the bank selection signal $11_1$ can be kept at H in the active sequence until the word line drive signal $7_1$ changes to H.

The first to third embodiments have exemplified four banks. However, the present invention is not limited to this and can be applied to a different number of banks.

In the first to third embodiments, signals such as the precharge signal reset signal 14 and word line drive signal set signal 10 are latched by the latch circuits $6_1$ to $6_4$, $66_1$ to $66_4$, and $96_1$ to $96_4$. Alternatively, only signals at the start of the active sequence and reset sequence may be latched, and remaining signals may be generated by arranging signal generators in the latch circuits $6_1$ to $6_4$, $66_1$ to $66_4$, and $96_1$ to $96_4$. For example, latching of the precharge signal reset signal 14 may be detected, and the word line drive signal set signal 10 delayed for a predetermined time may be generated. This arrangement can reduce the interconnection area, compared to the third embodiment, and can achieve multiplex processing.

The first to third embodiments have exemplified the semiconductor memory device in which a plurality of memory cells 17 are formed between the word lines $40_1$ to $40_m$ and bit line pairs $41_1$ to $41_n$. However, the length which is allowed to arrange word lines is limited. For this reason, in another semiconductor memory device, the word lines $40_1$ to $40_m$ in the above embodiments are formed as main word lines which are not directly connected to the memory cells 17. A sub-row decoder for dividing the main word lines into a plurality of sub-word lines is arranged. The memory cells 17 are formed at th(a intersections of the sub-word lines and bit line pairs $41_1$ to $41_n$. In this case, a signal for controlling the sub-row decoder may be generated by the row decoder or another circuit. In general, "word line" means all the sub-word line, main word line, and word lines $40_1$ to $40_m$ described in the above embodiments. The present invention can be similarly applied to a semiconductor device having such a sub-word line.

The present invention is associated with activation/inactivation of the row address in the bank. A method of inputting/outputting data to/from the chip is the same as in general-purpose DRAM and SDRAM.

What is claimed is:

1. A semiconductor memory device comprising:

a plurality of banks;

a timing control circuit connected in common to each of said plurality of banks to provide a first signal for activating each of said plurality of banks and a second signal for precharging each of said plurality of banks in a predetermined order at predetermined timings; and a plurality of latch circuits each of said plurality of latch circuits being coupled to a corresponding one of said plurality of banks for latching a state of a signal output from said timing control circuit, wherein each of said plurality of latch circuits provides output signals comprising a word line drive signal for controlling activation of a word line, a precharge signal for controlling precharging, and a sense amplifier enable signal for controlling a sense amplifier operation, wherein a first signal for activating each of said plurality of banks comprises a word line drive signal set signal for setting the word line drive signal to be active, a precharge signal reset signal for inactivating the precharge signal, and a sense amplifier enable signal set signal for setting the sense amplifier enable signal to be active, and wherein a second signal for precharging each bank includes a word line drive signal reset signal for setting the word line drive signal to be inactive, a precharge signal set signal for setting the precharge signal to be active, and a sense amplifier enable signal reset signal for setting the sense amplifier enable signal to be inactive.

2. A semiconductor memory device comprising:

a plurality of banks each having a plurality of memory cells respectively formed at intersections of a plurality of bit line pairs and a plurality of word lines, a plurality of precharge circuits each of which is arranged for each bit line pair to precharge said bit line pair when a precharge signal becomes active, a plurality of sense amplifiers each of which is arranged for each bit line pair to amplify a voltage output to the bit line pair when a sense amplifier enable signal becomes active, and a row decoder which incorporates a row latch circuit for latching one of a selected and an unselected state of a word line indicated by a row address when each bank is activated, and activates the word line indicated by said row latch circuit when a word line drive signal becomes active;

a timing control circuit having an active timing chain for controlling a word line drive signal set signal, a precharge signal reset signal, and a sense amplifier enable signal set signal in a first predetermined order at predetermined timings when a row address activation signal becomes active, and a precharge timing chain for controlling a word line drive signal reset signal, a precharge signal set signal, and a sense amplifier enable signal reset signal in a second predetermined order at predetermined timings when a row address inactivation signal becomes active;

a bank decoder for activating a bank selection signal for selecting a bank indicated by a bank address included in an address signal;

a row address buffer which outputs as a row address signal the row address included in the address signal; and a plurality of latch circuits each of which is coupled to one of said plurality of banks to receive the bank selection signal, activate the word line drive signal when a corresponding bank selection signal is active and the word line drive signal set signal becomes active, inactivate the word line drive signal when the word line drive signal reset signal becomes active, activate the precharge signal when the precharge signal set signal becomes active, inactivate the precharge signal when the precharge signal reset signal becomes active, activate the sense amplifier enable signal when the sense amplifier enable signal set signal becomes active, and to inactivate the sense amplifier enable signal when the sense amplifier enable signal reset signal becomes active.

3. A device according to claim 2, wherein each latch circuit comprises:

a first logic circuit for activating an output signal when both the word line drive signal set signal and the bank selection signal are active;

a second logic circuit for activating an output signal when both the word line drive signal reset signal and the bank selection signal are active;

a third logic circuit for activating an output signal when both the precharge signal set signal and the bank selection signal are active;

a fourth logic circuit for activating an output signal when both the precharge signal reset signal and the bank selection signal are active;

a fifth logic circuit for activating an output signal when both the sense amplifier enable signal set signal and the bank selection signal are active;

a sixth logic circuit for activating an output signal when both the sense amplifier enable signal reset signal and the bank selection signal are active;

a first flip-flop circuit which is set by the output signal from said first logic circuit, reset by the output signal from said second logic circuit, and outputs an output signal as the word line drive signal;

a second flip-flop circuit which is set by the output signal from said third logic circuit, reset by the output signal from said fourth logic circuit, and outputs an output signal as the precharge signal; and a third flip-flop circuit which is set by the output signal from said fifth logic circuit, reset by the output signal from said sixth logic circuit, and outputs an output signal as the sense amplifier enable signal.

4. A device according to claim 2, wherein said device further comprises a precharge bank decoder for activating a precharge bank selection signal for selecting a bank indicated by a precharge bank address included in the address signal, and said latch circuit activates the word line drive signal reset signal, the precharge signal set signal, and the sense amplifier enable signal reset signal as signals for performing precharging only when the precharge bank selection signal is active.

5. A device according to claim 4, wherein each latch circuit comprises:

a first logic circuit for activating an output signal when both the word line drive signal set signal and the bank selection signal are active;

a second logic circuit for activating an output signal when both the word line drive signal reset signal and the precharge bank selection signal are active;

a third logic circuit for activating an output signal when both the precharge signal set signal and the precharge bank selection signal are active;

a fourth logic circuit for activating an output signal when both the precharge signal reset signal and the bank selection signal are active;

a fifth logic circuit for activating an output signal when both the sense amplifier enable signal set signal and the bank selection signal are active;

a sixth logic circuit for activating an output signal when both the sense amplifier enable signal reset signal and the precharge bank selection signal are active;

a first flip-flop circuit which is set by the output signal from said first logic circuit, reset by the output signal from said second logic circuit, and outputs an output signal as the word line drive signal;

a second flip-flop circuit which is set by the output signal from said third logic circuit, reset by the output signal from said fourth logic circuit, and outputs an output signal as the precharge signal; and a third flip-flop circuit which is set by the output signal from said fifth logic circuit, reset by the output signal from said sixth logic circuit, and outputs an output signal as the sense amplifier enable signal.

6. A semiconductor memory device comprising:

a plurality of banks each having a plurality of memory cells respectively formed at intersections of a plurality of bit line pairs and a plurality of word lines, a plurality of precharge circuits each of which is arranged for each bit line pair and precharges the bit line pair when a precharge signal becomes active, a plurality of sense amplifiers each of which is arranged for each bit line pair and amplifies a voltage output to the bit line pair when a sense amplifier enable signal becomes active, and a row decoder which operates when a word line drive signal becomes active, and latches a row address signal to activate a word line indicated by the row address signal only when a bank selection signal is active;

a timing control circuit having an active timing chain for, when a row address activation signal becomes active, controlling in a first predetermined order at a predetermined timing a word line drive signal set signal and a sense enable signal serving as a signal for controlling timings at which the sense amplifier enable signal is activated, and a precharge timing chain for controlling a precharge signal set signal and a sense amplifier enable signal reset signal in a second predetermined order at predetermined timings when a row address inactivation signal becomes active;

a bank decoder for activating a bank selection signal for selecting a bank indicated by a bank address included in an address signal;

a precharge bank decoder for activating a precharge bank selection signal for selecting a bank indicated by a precharge bank address included in the address signal;

a row address buffer for outputting as the row address signal a row address included in the address signal; and a plurality of latch circuits each of which is coupled to one of said plurality of banks to receive the bank selection signal, activate the word line drive signal when a corresponding bank selection signal and the word line drive signal set signal become active, inactivate the word line drive signal when the precharge bank selection signal becomes active, activate the precharge signal when the precharge bank selection signal and the precharge signal set signal become active, inactivate the precharge signal when the bank selection signal becomes active, activate the sense amplifier enable signal when the bank selection signal and the sense enable signal become active, and to inactivate the sense amplifier enable signal when the precharge bank selection signal and the sense amplifier enable signal reset signal become active.

7. A device according to claim 6, wherein each latch circuit comprises:

a first logic circuit for activating an output signal when both the word line drive signal set signal and the bank selection signal are active;

a second logic circuit for activating an output signal when both the precharge signal set signal and the precharge bank selection signal are active;

a third logic circuit for activating an output signal when both the sense amplifier enable signal reset signal and the precharge bank selection signal are active;

a first flip-flop circuit which is set by the output signal from said first logic circuit, reset by the precharge bank selection signal, and outputs an output signal as the word line drive signal;

a second flip-flop circuit which is set by the output signal from said second logic circuit, reset by the bank selection signal, and outputs an output signal as the precharge signal;

a third flip-flop circuit which is set by the bank selection signal and reset by the output signal from said third logic circuit; and a circuit for latching an output signal from said third flip-flop circuit and outputting the output signal as the sense amplifier enable signal when the sense enable signal becomes active.

* * * * *